US011626801B2

(12) United States Patent
Zambetti

(10) Patent No.: US 11,626,801 B2
(45) Date of Patent: Apr. 11, 2023

(54) STACKED BUCK CONVERTERS AND ASSOCIATED METHOD OF OPERATION

(71) Applicant: STMicroelectronics S.r.l., Agrate Brianza (IT)

(72) Inventor: Osvaldo Enrico Zambetti, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/496,523

(22) Filed: Oct. 7, 2021

(65) Prior Publication Data

US 2022/0029539 A1 Jan. 27, 2022

Related U.S. Application Data

(63) Continuation of application No. 16/680,084, filed on Nov. 11, 2019, now Pat. No. 11,201,544.

(30) Foreign Application Priority Data

Dec. 4, 2018 (IT) .......................... 102018000010781

(51) Int. Cl.
*H02M 3/158* (2006.01)
*G01R 31/327* (2006.01)
*H02M 1/00* (2006.01)

(52) U.S. Cl.
CPC ...... *H02M 3/1584* (2013.01); *G01R 31/3278* (2013.01); *H02M 1/0074* (2021.05)

(58) Field of Classification Search
CPC ................................................. H02M 3/1584
See application file for complete search history.

(56) References Cited

U.S. PATENT DOCUMENTS 8,963,519 B2   2/2015   Zambetti et al.
10,141,849 B1  11/2018  Jiang et al.
(Continued)

FOREIGN PATENT DOCUMENTS

CN   107482914 A      12/2017
CN   108539981 A  *   9/2018   .............. H02M 1/42
(Continued)

OTHER PUBLICATIONS

Shenoy, P., "Introduction to the Series Capacitor Buck Converter," Application Report, SLVA750A, Apr. 2016—Revised May 2016, 15 pages, Texas Instruments.

*Primary Examiner* — Sisay G Tiku
(74) *Attorney, Agent, or Firm* — Slater Matsil, LLP

(57) ABSTRACT

A converter includes two switching stages coupled in series between positive and negative input terminals. A control circuit is configured for driving the switching stages based on an output voltage of the converter. A first switching stage includes two switches coupled in series between a positive input terminal and a first node. A capacitor and an inductor are coupled in series between the two switches and a positive output terminal. A third switch is coupled between a node between the capacitor and the inductor and the negative input terminal. A second capacitor is coupled between the first node and the negative input terminal. A second switching stage includes a second node coupled to the first node. Two additional electronic switches are coupled in series between the second node and the negative input terminal. A second inductor is coupled between the two additional switches and the positive output terminal.

20 Claims, 14 Drawing Sheets

(56) References Cited

U.S. PATENT DOCUMENTS

| | | |
|---|---|---|
| 10,615,692 B2 | 4/2020 | Khayat et al. |
| 10,833,585 B2 | 11/2020 | Tang et al. |
| 2002/0118000 A1 | 8/2002 | Xu et al. |
| 2011/0227546 A1 | 9/2011 | Nishijima et al. |
| 2013/0038302 A1 | 2/2013 | Qian et al. |
| 2015/0002115 A1 | 1/2015 | Shenoy et al. |
| 2015/0015225 A1 | 1/2015 | Cheng |
| 2015/0311792 A1 | 10/2015 | Amaro et al. |
| 2015/0311794 A1 | 10/2015 | Khayat et al. |
| 2016/0056709 A1 | 2/2016 | Khayat |
| 2016/0261190 A1 | 9/2016 | Shenoy |
| 2017/0324326 A1 | 11/2017 | Liu et al. |
| 2019/0379272 A1* | 12/2019 | Carpenter ............. H02M 3/155 |
| 2019/0386566 A1* | 12/2019 | Zhang ................... H02M 1/15 |
| 2021/0399642 A1* | 12/2021 | Yao ..................... H02M 3/1586 |
| 2022/0190738 A1* | 6/2022 | Chen .................... H02M 3/158 |
| 2022/0209660 A1* | 6/2022 | Sun ....................... H02M 1/15 |

FOREIGN PATENT DOCUMENTS

| | | | | |
|---|---|---|---|---|
| CN | 108736709 A | * | 11/2018 | ............ H02M 1/088 |
| CN | 211046763 U | | 7/2020 | |
| CN | 111726001 A | * | 9/2020 | ......... H02M 1/0058 |
| CN | 112615553 A | * | 4/2021 | ............ H02M 1/007 |
| CN | 112821757 A | * | 5/2021 | ............ H02M 3/155 |

* cited by examiner

STACKED BUCK CONVERTERS AND ASSOCIATED METHOD OF OPERATION

CROSS-REFERENCE TO RELATED APPLICATIONS

This application is a continuation of U.S. patent application Ser. No. 16/680,084, entitled "Stacked Buck Converters and Associated Method Of Operation," and filed on Nov. 11, 2019, which claims priority to Italian Application No. 102018000010781, filed on Dec. 4, 2018, which applications are hereby incorporated herein by reference.

TECHNICAL FIELD

The embodiments of the present disclosure refer to electronic converters.

BACKGROUND

Non-insulated voltage converters of a step-down type are widely used, for example, in the field of power management. The ease of use, simplicity, and excellent versatility in various conditions of input and output voltage render the buck topology one of the most widely used for this type of conversion.

FIG. 1 shows the circuit diagram of a typical buck converter 1.

In particular, a buck converter 1 comprises two input terminals 10a and 10b for receiving a voltage $V_{in}$, and two output terminals 12a and 12b for supplying a (e.g., regulated) voltage $V_{OUT}$, where the output voltage is equal to or lower than the input voltage $V_{in}$.

In particular, typically the buck converter 1 comprises an electronic switch Q1 and an inductor L, which are connected (for example, directly) in series between the positive input terminal 10a and the positive output terminal 12a. Instead, the negative output terminal 12b is connected (for example, directly) to the negative input terminal 10b, which typically represents a ground GND. Finally, a second electronic switch Q2 is connected (for example, directly) between the negative terminal 10b (or else the negative terminal 12b) and the intermediate point between the electronic switch Q1 and the inductor L. The switches Q1 (high-side switch) and Q2 (low-side switch) hence represent a half-bridge, connected (for example, directly) between the terminals 10a and 10b, where the inductor L is connected (for example, directly) between the intermediate point of the half-bridge and the output terminal 12a.

Frequently, the switches Q1 and/or Q2 are transistors, for example FETs (Field-Effect Transistors), such as n-channel MOSFETs. As shown in FIG. 1, each switch Q1/Q2 has associated, i.e., connected in parallel, thereto a diode D1/D2, which typically represents the body diode of the transistor, and a capacitance C1/C2, which typically represents the parasitic output capacitance of the transistor. Frequently, the second electronic switch Q2 is implemented just with the diode D2, where the anode is connected to the terminal 12b and the cathode is connected to the switch Q1.

In the example considered, in order to stabilise the output voltage $V_{OUT}$, the converter 1 typically comprises a capacitor $C_{OUT}$, connected (for example, directly) between the output terminals 12a and 12b.

In this context, FIG. 2 shows some waveforms of the signals of such an electronic converter; namely:

- the signal $DRV_1$ for switching the electronic switch Q1;
- the signal $DRV_2$ for switching the second electronic switch Q2;
- the current $I_{Q1}$ through the electronic switch Q1;
- the voltage $V_S$ on the intermediate point between the electronic switch Q1 and the inductor L (i.e., the voltage on the second switch Q2);
- the current $I_L$ through the inductor L; and
- the electrical losses $P_{Q1}$ in the switch Q1.

In particular, when the electronic switch Q1 is closed at an instant $t_1$ (ON state), the current $I_L$ in the inductor L grows linearly. The electronic switch Q2 is simultaneously opened (with the diode D2 reverse biased). When the electronic switch Q1 is opened after an interval $T_{ON1}$ at an instant $t_2$ (OFF state), the electronic switch Q2 is closed (with the diode D2 forward biased), and the current $I_L$ drops linearly. Finally, the switch Q1 is closed again after an interval $T_{OFF1}$. In the example considered, the switch Q2 (or a similar diode) is hence closed when the switch Q1 is open, and vice versa.

The current $I_L$ can hence be used for charging the capacitor $C_{OUT}$ that supplies the voltage $V_{OUT}$ to the terminals 12a and 12b.

In general, the electronic converter 1 comprises a control circuit 14, which drives switching of the switch Q1, and possibly of the switch Q2 so as to repeat the intervals $T_{ON1}$ and $T_{OFF1}$ periodically.

Multiple driving schemes are known for the switch Q1 and possibly the switch Q2. These solutions have in common the possibility, by regulating the duration of the interval $T_{ON1}$ and/or the interval $T_{OFF1}$, of regulating the output voltage $V_{OUT}$.

For instance, in many applications, the control circuit 14 generates a driving signal $DRV_1$ for the switch Q1 (and possibly a driving signal $DRV_2$ for the switch Q2), where the driving signal $DRV_1$ is a PWM (Pulse-Width Modulation) signal; in particular, the duration of the switching interval $T_{SW1}=T_{ON1}+T_{OFF1}$ is constant, but the working cycle $T_{ON1}/T_{SW1}$ may be variable. In this case, the control circuit 14 typically implements a PI (Proportional-Integral) regulator or a PID (Proportional-Integral-Derivative) regulator configured for varying the working cycle of the signal $DRV_1$ in such a way as to obtain a required output voltage $V_{OUT}$. In this case, the various operating modes of the converter, CCM (Continuous-Conduction Mode), DCM (Discontinuous-Conduction Mode), and TM (Transition Mode), are well known in this context.

Power distribution is continuously evolving from various points of view, such as power density, efficiency, and cost of the solution. For instance, to meet the increasingly stringent requisites of power density the size of the magnetic components is reduced, thereby causing an increase to the operating frequency of the system. However, as is well known, as the operating frequency increases, also the switching losses increase in a linear way. Hence, in order to increase the switching frequency of the system it is generally necessary to minimise the switching losses, for example, to increase the speed of the transistor. To meet these increasingly stringent requisites of high efficiency, there have been developed switching elements with increasing performance in terms of switching speed and figure of merit (which is given by the resistance of the switch Q1 in the closed condition Rdson multiplied by the charge Qg required for the switch Q1 to close).

The MOSFETs with higher switching speeds hence permits an increase in the switching frequency in order to reduce the magnetic components (inductances) and hence an increase in the power density of the conversion systems. However, the use of faster transistors involves the development of more costly technologies with a consequent major impact on the cost of the final solution of the converter.

Another way of minimising the switching losses is to get MOSFETs to operate with lower drain-to-source voltages. There have then been developed solutions for getting FETs to work with a fraction of input voltage $V_{in}$.

For instance, in this context, the paper by Pradeep S. Shenoy, Application Report SLVA750A, "*Introduction to the Series Capacitor Buck Converter*", Texas Instruments, April 2016—Revised on May 2016, available on http://www.ti.com/lit/an/slva750a/slva750a.pdf describes a solution referred to as "*Series Capacitor Buck converter*", i.e., a buck converter with a capacitor connected in series. Moreover, the document US 2015/0002115 A1 describes the corresponding multiphase configuration. The advantage of this type of converter is the use of four MOSFETs to provide two phases of a multiphase converter.

SUMMARY

However, the inventor has noted that this topology presents a duty cycle limited to 50%. The latter limit not only represents a limit in the value of regulation of the maximum output voltage $V_{OUT}$, equal to $V_{in}/4$ (see, for example, Eq. (6) of the report SLVA750A), but also a limit on the response to load transients. For instance, in IBC (Intermediate Bus Converter) regulation systems, the 12-V output voltage $V_{OUT}$ is frequently derived from a voltage $V_{in}$ typically ranging between 40 V and 60 V. In this case, the minimum voltage value of 40 V does not allow this structure to set a regulated output voltage of 12 V.

Considering the foregoing, various embodiments provide solutions capable of overcoming the limit of a duty cycle of 50% in a buck converter with capacitor connected in series.

One or more embodiments relate to an electronic converter presenting the distinctive elements specified in the ensuing claims. Some embodiments moreover concern a corresponding control method.

In various embodiments, the electronic converter comprises a positive input terminal and a negative input terminal for receiving an input voltage, and a positive output terminal and a negative output terminal for supplying an output voltage. In various embodiments, a capacitor is connected between the positive output terminal and the negative output terminal.

In various embodiments, the electronic converter comprises a plurality of switching stages connected in series between the positive input terminal and the negative input terminal. In particular, this set of switching stages comprises at least one first switching stage and one last switching stage. Also one or more further switching stages may be provided between the first switching stage and the last switching stage.

In various embodiments, the first switching stage comprises a first node and a second node, where the first node is connected to the positive input terminal. A first electronic switch and a second electronic switch are connected in series between the first and second nodes. A first capacitor and an inductor are connected in series between the intermediate point between the first and second electronic switches, and the positive output terminal. A third electronic switch is connected between the intermediate point between the first capacitor and the inductor, and the negative input terminal. A second capacitor is connected between the second node and the negative input terminal.

In various embodiments, the last switching stage comprises a first node, which is connected, either directly or by using one or more further switching stages, to the second node of the first switching stage. A first electronic switch and a second electronic switch are connected in series between the first node and the negative input terminal, and an inductor is connected between the intermediate point between the first and second electronic switches and the positive output terminal.

In various embodiments, possible further switching stages connected between the first and last switching stages have the same structure as the first switching stage. In particular, each of the one or more further switching stages comprises a first node and a second node, where the first node is connected to a previous switching stage, in particular to the second node of the previous switching stage, and the second node is connected to a next switching stage, in particular to the first node of the next switching stage. Two electronic switches are connected in series between the first and second nodes. A first capacitor and an inductor are connected in series between the two electronic switches and the positive output terminal. A third electronic switch is connected between the intermediate point between the first capacitor and the inductor and the negative input terminal. A second capacitor is connected between the second node and the negative input terminal.

In various embodiments, a control circuit is configured for driving the switching stages as a function of the output voltage. In particular, in various embodiments, the control circuit is configured for periodically closing with a given switching period the first electronic switch of the first switching stage, where the first electronic switch of the first switching stage is closed for a given ON time. When the first electronic switch of the first switching stage is closed, the control circuit simultaneously opens the second and third electronic switches of the first switching stage. Instead, when the first electronic switch of the first switching stage is opened, the control circuit simultaneously closes the second and third electronic switches of the first switching stage. For instance, in various embodiments, the control circuit is configured for driving the first electronic switch of the first switching stage with a first PWM driving signal and the second and third electronic switches of the first switching stage with a second PWM driving signal. In this case, the second PWM driving signal may correspond to the first PWM driving signal inverted.

In various embodiments, the control circuit is also configured for periodically closing with the given switching period (i.e., the switching period of the first switching stage) the first electronic switch of the last switching stage, where the first electronic switch of the last switching stage is closed for the given ON time (i.e., the ON time of the first switching stage). When the first electronic switch of the last switching stage is closed, the control circuit simultaneously opens the second electronic switch of the last switching stage. Instead, when the first electronic switch of the last switching stage is opened, the control circuit simultaneously closes the second electronic switch of the last switching stage. For instance, in various embodiments, the control circuit is configured for driving the first electronic switch of the last switching stage with a third PWM driving signal and the second electronic switch of the last switching stage with a fourth PWM driving signal. In this case, the fourth PWM driving signal may correspond to the third PWM driving signal inverted.

Consequently, in various embodiments, the first electronic switch of the first switching stage and the first electronic switch of the last switching stage are closed with the same switching period and for the same ON time, but the closings may be phase-shifted with respect to one another. In particular, in various embodiments, the electronic converter enables the first and third PWM driving signals to have a working cycle higher than 50%. The same applies also to possible further switching stages connected between the first and last switching stages.

In various embodiments, in order to regulate the output voltage, the control circuit can use a regulation with constant ON time; i.e., the control circuit varies the switching period as a function of the output voltage.

In various embodiments, the electronic converter may also comprise a second set of a plurality of switching stages connected in series between the positive input terminal and the negative input terminal. In this case, also the second set of one plurality of switching stages comprises at least a first switching stage and a last switching stage, which have the same structure as the first and last switching stages described previously.

In this case, the control circuit can also effect a balancing of the current supplied by the two chains of switching stages. In particular, for this purpose, the control circuit may vary the ON time of the first set of switching stages and the ON time of the second set of switching stages in such a way that both of the sets supply the same (mean) current value. For instance, for this purpose, the control circuit can detect by using an analog and/or a digital filter the mean value of the sum of the currents supplied by the switching stages of each set/chain of switching stages.

BRIEF DESCRIPTION OF THE DRAWINGS

The embodiments of the present disclosure will now be described with reference to the annexed drawings, which are provided purely to way of non-limiting example, and in which.

DETAILED DESCRIPTION OF ILLUSTRATIVE EMBODIMENTS

In the ensuing description, various specific details are illustrated aimed at providing an in-depth understanding of the embodiments. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to one and the same embodiment. Moreover, particular conformations, structures, or characteristics may be combined in any adequate way in one or more embodiments.

The references used herein are merely provided for convenience and hence do not define the sphere of protection or the scope of the embodiments.

Figure 1:
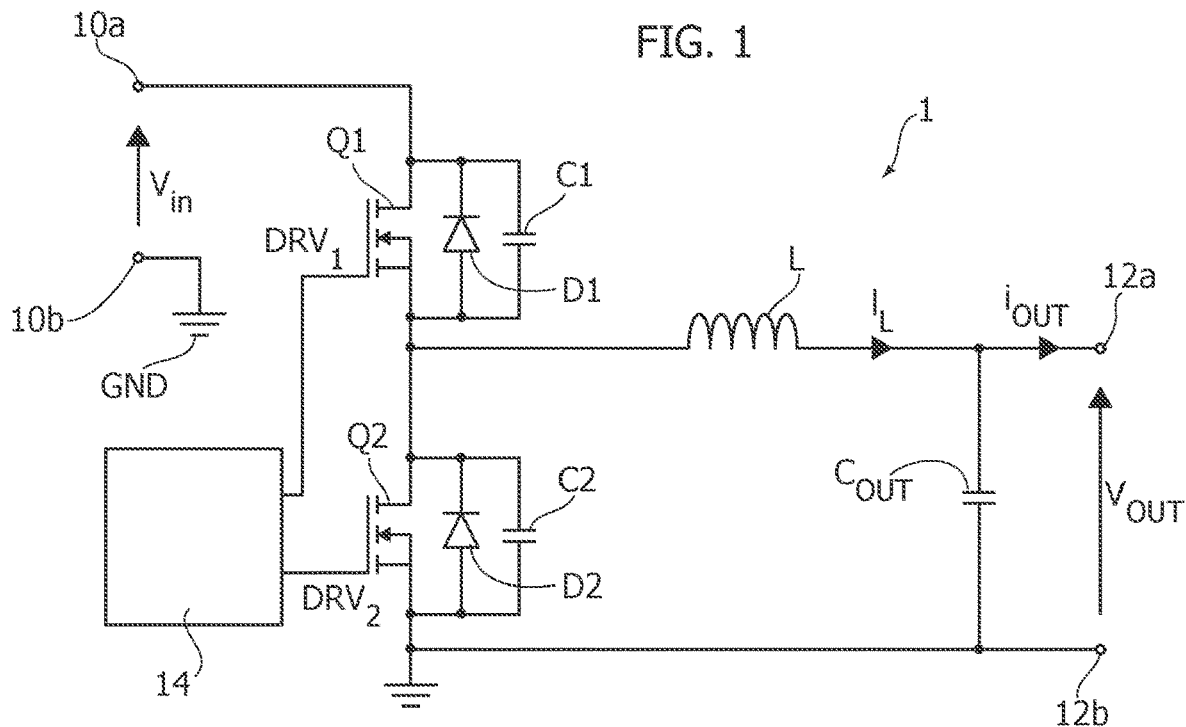
FIG. 1 shows a buck converter.
Figure 2:
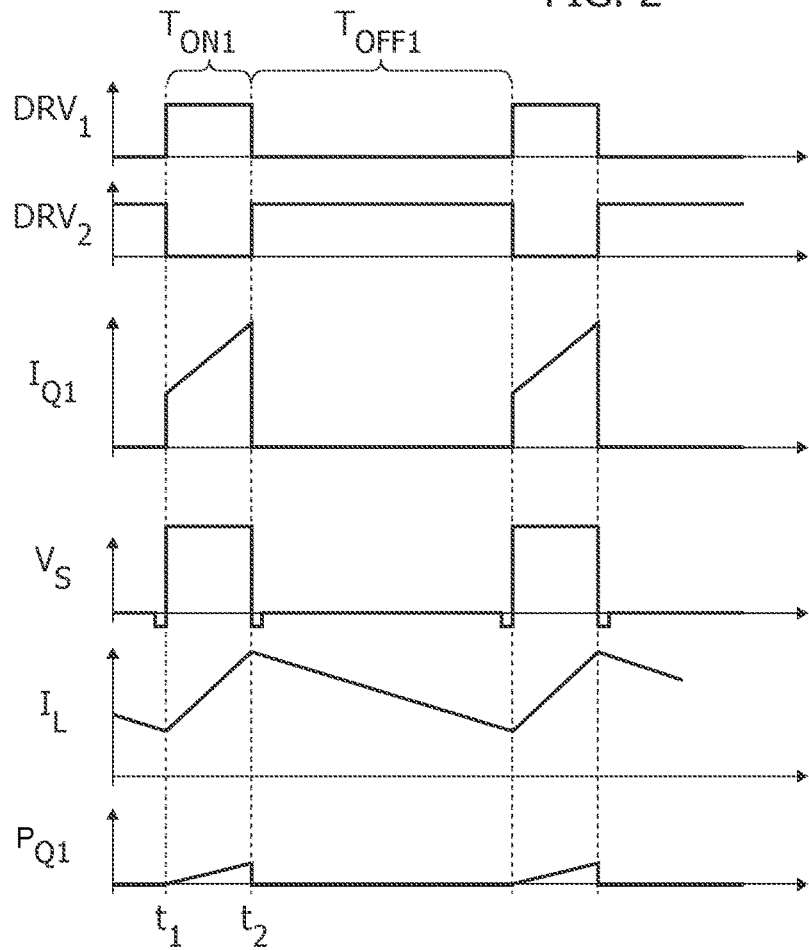
FIG. 2 shows waveforms of the buck converter of FIG. 1.

In the ensuing FIGS. 3 to 15, parts, elements, or components that have already been described with reference to FIGS. 1 to 2 are designated by the same references as the ones used previously in these figures; the description of these elements presented previously will not be repeated in what follows in order not to burden the present detailed description.

Figure 3:
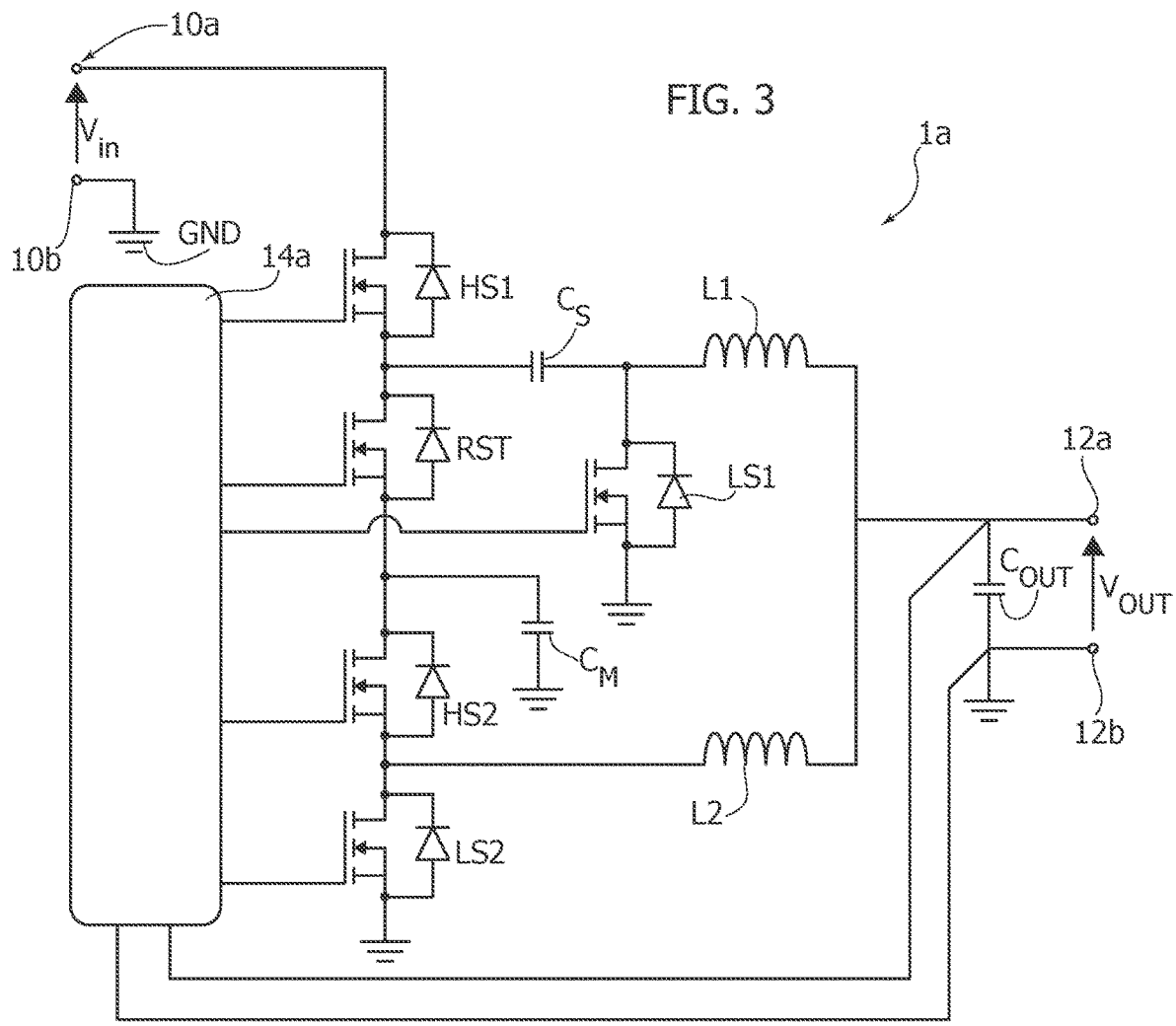
FIG. 3 shows an electronic converter according to the present description.

FIG. 3 shows a first embodiment of an electronic converter 1a according to the present description. Also in this case, the electronic converter 1a comprises:

two input terminals 10a and 10b configured for receiving a D.C. input voltage $V_{in}$; and two output terminals 12a and 12b configured for supplying a D.C. output voltage $V_{OUT}$.

In the embodiment considered, the negative output terminal 12b is connected (for example, directly) to the negative input terminal 10b, which represents a ground GND. In the embodiment considered, a capacitor $C_{OUT}$ is connected (for example, directly) between the output terminals 12a and 12b.

In the embodiment considered, four electronic switches HS1, RST, HS2, and LS2 are connected (for example, directly) in series between the input terminals 10a and 10b. For instance, in the embodiment considered, the switches HS1, RST, HS2, and LS2 are FETs, preferably an n-channel FETs, for example MOSFETs.

In particular, in the embodiment considered, the intermediate point between the switches HS1 and RST, for example the source terminal of the transistor HS1/drain terminal of the transistor RST, is connected (for example, directly) via a capacitor $C_S$ and an inductor L1 to the output terminal 12a. In particular, a first terminal of the capacitor $C_S$ is connected to the intermediate point between the switches HS1 and RST, and the second terminal of the capacitor $C_S$ is connected through the inductor L1 to the terminal 12a. Moreover, a further electronic switch LS1, such as a FET, preferably an n-channel FET, for example a MOSFET, is connected (for example, directly) between the second terminal of the capacitor $C_S$ (i.e., the intermediate point between the capacitor $C_S$ and the inductor L1) and the negative input terminal 10b/ground GND.

In the embodiment considered, the intermediate point between the switches HS2 and LS2, for example the source terminal of the transistor HS2/drain terminal of the transistor LS2, is connected (for example, directly) via an inductor L2 to the output terminal 12a.

Finally, in the embodiment considered, the intermediate point between the switches RST and HS2, for example the source terminal of the transistor RST/drain terminal of the transistor HS2, is connected (for example, directly) via a capacitor $C_M$ to the negative input terminal 10b/ground GND.

Hence, the electronic converter 1a illustrated in FIG. 3, comprises two buck stages/phases:

the first phase is represented by the switches LS2, HS2 and the inductor L2; and the second phase is represented by the switches HS1, LS1, and RST, the capacitor $C_S$, and the inductor L1.

In particular, as compared to a conventional buck converter with capacitor in series (represented by the capacitor $C_S$), the electronic converter 1a illustrated in FIG. 3 hence comprises the electronic switch, for example MOSFET, RST and the capacitor/capacitance $C_M$. As will be explained hereinafter, thanks to the presence of these two components, the two buck phases may be completely independent, also with duty cycles greater than 50%. Moreover, the inventor has noted that the response of the system is substantially the equivalent response of a multiphase buck with two phases, it being able, in the event of load transient, to increase the duty cycle to values higher than 50% by superposing the ON periods of the switches HS1 and HS2, which is not possible with a traditional buck converter with series capacitor.

In the embodiment considered, the electronic switches HS1, LS1, RST, HS2, and LS2 are hence driven via a control circuit 14.a that generates respective driving signals $D_{HS1}$, $D_{LS1}$, $D_{RST}$, $D_{HS2}$, and $D_{LS2}$.

In particular, in various embodiments, the driving signal $D_{RST}$ for the switch RST is in phase with the driving signals $D_{HS1}$, $D_{LS1}$ for the switches HS1 and LS1. Specifically, in various embodiments, the driving signal $D_{LS1}$ for the switch LS1 corresponds to the inverted version of the driving signal HLS1 for the switch HS1, and the driving signal $D_{RST}$ for the switch RST corresponds to the driving signal $D_{LS1}$ for the switch LS1; i.e., the control circuit 14a is configured for periodically repeating the following intervals:

during a first interval $T_{ON1}$, closing the switch HS1 and opening the switches LS1 and RST; and during a second interval $T_{OFF1}$, opening the switch HS1 and closing the switches LS1 and RST.

Consequently, in various embodiments, the switching period $T_{SW1}$ for the switches HS1, LS1, and RST is $T_{SW1}=T_{ON1}+T_{OFF1}$; i.e., driving of the switch HS1 corresponds to a pulse width modulation in which the working cycle is $T_{ON1}/T_{SW1}$.

Likewise, the driving signals $D_{HS2}$, $D_{LS2}$ for the switches HS2 and LS2 are synchronised, and the driving signal $D_{LS2}$ for the switch LS2 corresponds to the inverted version of the driving signal $H_{LS2}$ for the switch HS2; i.e., the control circuit 14a is configured for repeating the following intervals periodically:

during a first interval $T_{ON2}$, closing the switch HS2 and opening the switch LS2; and during a second interval $T_{OFF2}$, opening the switch HS2 and closing the switch LS2.

Consequently, in various embodiments, the switching period $T_{SW2}$ for the switches HS2 and LS2 is $T_{SW2}=T_{ON1}+T_{OFF2}$; i.e., driving of the switch HS2 corresponds to a pulse width modulation in which the working cycle is $T_{ON2}/T_{SW2}$.

In general, it is not required for the driving signals $D_{HS2}$, $D_{LS2}$ to be synchronised with the driving signals $D_{HS1}$, $D_{LS1}$, and $D_{RST}$. However, for reasons of regulation it may be preferable for the driving signal $D_{HS2}$ to have a constant phase P with respect to the driving signal $D_{HS1}$. Consequently, in this case, the switching period $T_{SW1}$ corresponds to the switching period $T_{SW2}$, i.e., $T_{SW1}=T_{SW2}$.

Moreover, in some embodiments, to minimise the ripple on the voltage $V_M$ across the capacitor $C_M$, an interleaving of 50% between the two phases is preferable; i.e., the control circuit 14a is configured for closing the switch HS2 substantially at a time $T_{SW1}/2$ from start of a switching cycle $T_{SW1}$, i.e., from closing of the switch HS1. As mentioned previously, this is not necessary from the standpoint of operation of the topology in so far as it also enables superposition of ON periods of the two switches HS1 and HS2, unlike the prior art referred to.

As will be explained in greater detail hereinafter, by adopting an appropriate driving of the switches HS1, LS1, RST, HS2, and LS2, these switches work at a maximum operating voltage across them of $V_{in}/2$. For this reason, a class of FETs/MOSFETs with higher figures of merit can be used for improving the efficiency or else for doubling the switching frequency, and the output inductances L1 and L2 may be smaller, thus increasing the power density of the cell.

Hence, assuming a phase shift P of 50% between the driving signals $D_{HS1}$ and $D_{HS2}$, there exist two driving scenarios:

in the first case, with a duty cycle $T_{ON1}/T_{SW1}$ of less than 50%, the switch HS2 is set into the closed condition when the switch HS1 is open; and in the second case, with a duty cycle $T_{ON1}/T_{SW1}$ of more than 50%, the switch HS2 is set into the closed condition when the switch HS2 is open.

Figure 4:
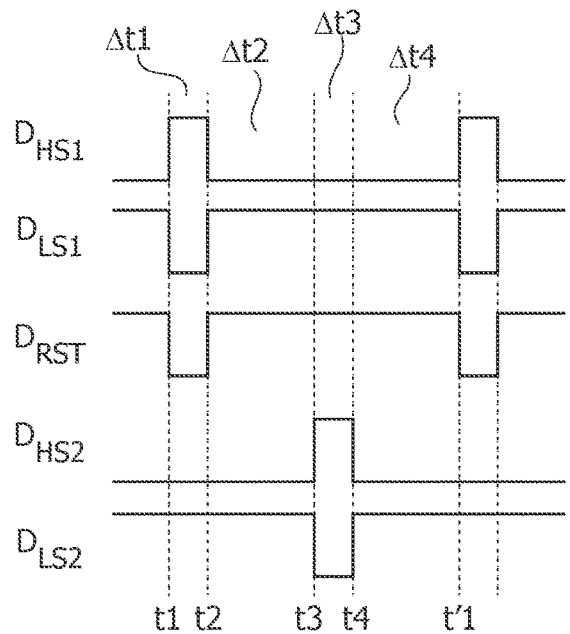
FIG. 4 shows driving signals for a first operation of the converter of FIG. 3.

The first case is schematically illustrated in FIG. 4, which shows an embodiment of the driving signals $D_{HS1}$, $D_{LS1}$, $D_{RST}$, $D_{HS2}$, and $D_{LS2}$ for the switches HS1, LS1, RST, HS2, and LS2.

In particular, in the embodiment considered, the control circuit 14a is configured for:

at an instant $t_1$, closing the switch HS1 and opening the switches LS1 and RST;

at an instant $t_2$, opening the switch HS1 and closing the switches LS1 and RST;

at an instant $t_3$, closing the switch HS2 and opening the switch LS2; and at an instant $t_4$, opening the switch HS1 and closing the switch LS2.

Consequently, during a first interval $\Delta t1$ (between the instants $t_1$ and $t_2$), the switches HS1 and LS2 are closed, and the switches LS1, RST, and HS2 are open. During a second interval $\Delta t2$ (between the instants $t_2$ and $t_3$), the switches LS1, RST, and LS2 are closed, and the switches HS1 and HS2 are open. During a third interval $\Delta t3$ (between the instants $t_3$ and $t_4$), the switches LS1, RST, and HS2 are closed, and the switches HS1 and LS2 are open. Finally, during a fourth interval $\Delta t4$ (between the instants $t_4$ and the next instant $t_1'$), the switches LS1, RST, and LS2 are closed, and the switches HS1 and HS2 are open.

Hence, in the embodiment considered, the time $T_{SW1}$ of a switching cycle corresponds to the sum of the duration of the four intervals, namely:

$$T_{SW1}=T_{SW2}=\Delta t1+\Delta t2+\Delta t3+\Delta t4.$$

Moreover, the closing time $T_{ON1}$ of the switch HS1 corresponds to the time $\Delta t1$, i.e., $T_{ON1}=\Delta t1$, the closing time $T_{ON2}$ of the switch HS2 corresponds to the time $\Delta t3$, i.e., $T_{ON2}=\Delta t3$, and the phase shift P between the switches HS1 and HS2 is $P=(\Delta t1+\Delta t2)/T_{SW1}$.

Figure 5A:
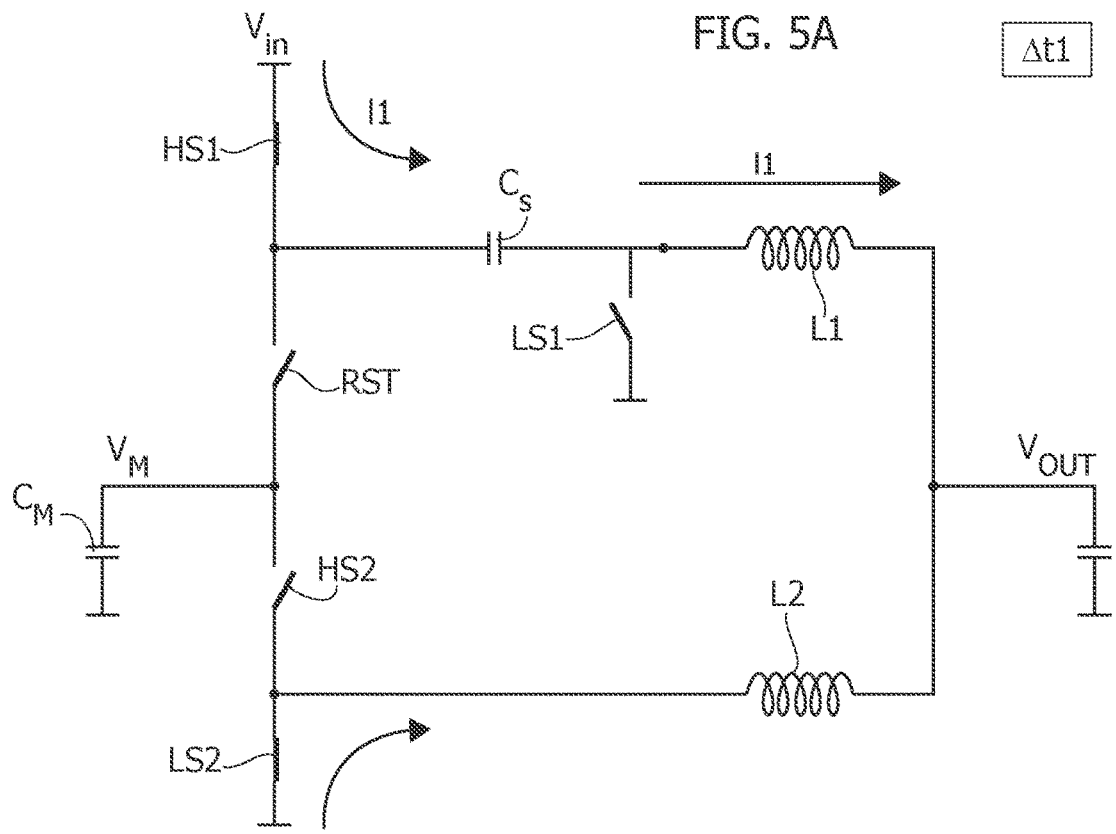
FIGS. 5A to 5D show the operating steps for the driving illustrated in FIG. 4.

FIG. 5A shows in this context operation during the first interval $\Delta t1$.

This step substantially corresponds to an energising step. In particular, if the voltage across the capacitor $C_S$ is denoted by $V_S$, the voltage on the first terminal of the inductor L1 (terminal connected to the capacitor $C_S$) is equal to $V_{in}-V_S$ (switch HS1 closed and switch LS1 open). Instead, the voltage on the second terminal of the inductor L1 corresponds to the voltage $V_{OUT}$. In the embodiment considered, a voltage $V_{in}-V_S-V_{OUT}$ is hence applied to the inductor L1. Consequently, since the voltage on the inductor L1 should be positive during this operating step, the current I1 through the inductor L1 increases, as occurs in a traditional buck converter.

Therefore, when the switch HS1 is set into the open condition and the switch LS1 is set into the closed condition, the first terminal of the inductor L1 (terminal connected to the capacitor $C_S$) is now connected to the terminal 10b/ ground GND. This is illustrated also in FIG. 5B. Consequently, during this operating step, the voltage on the inductor L1 is negative and the current I1 through the inductor L1 decreases, as occurs in a traditional buck converter.

Figure 5B:
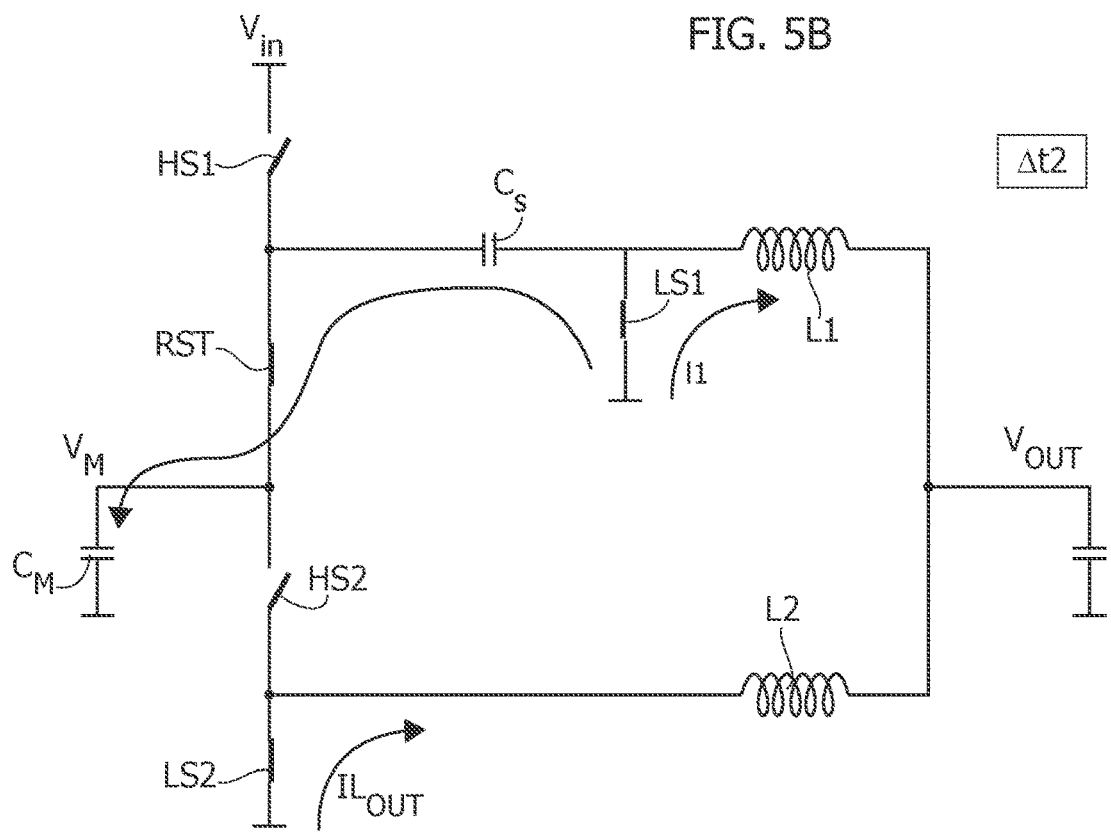

However, as also illustrated in FIG. 5B, during the second operating interval Δt2 also the switch RST is closed. Consequently, the capacitor $C_S$ is connected in parallel with the capacitor $C_M$; i.e., the capacitor transfers a part of its charge onto the capacitor $C_S$, and the voltage $V_M$ rises by an amount $\Delta V_{M1}$ given by the following formula:

$$\Delta V_{M1} = T_{ON1} \cdot I1 / (C_S + C_M)$$

where $T_{ON1}$ corresponds to the duration Δt1, i.e., the ON time of the switch HS1.

The charge accumulated during energising of the first phase (HS1, LS1, L1) of the converter is hence stored by using the switch RST in the capacitor $C_M$. The charge stored in the capacitor $C_M$ can hence be used in turn for supplying the energy for the second phase of the converter (HS2, LS2, L2).

Figure 5C:
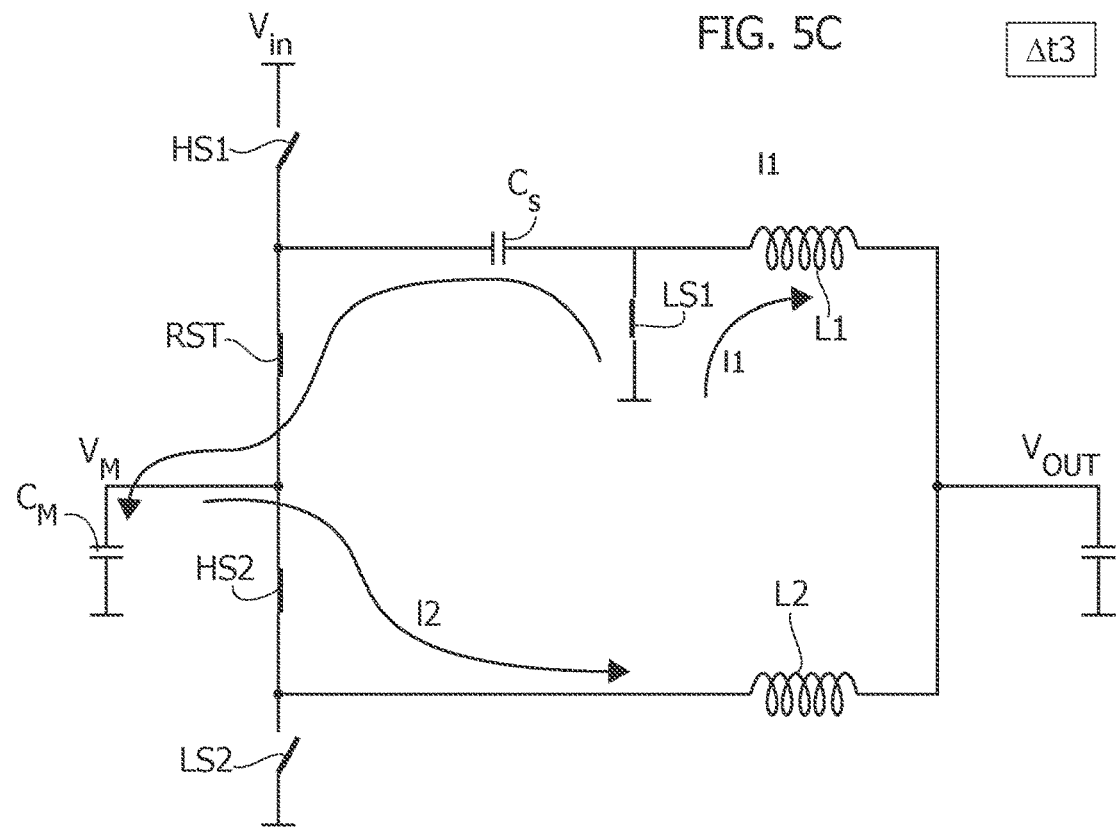

Hence, as illustrated in FIG. 5C, during the interval Δt3, the switch HS2 is closed and the switch LS1 is open. In this case, the first terminal of the inductor L2 (terminal connected to the switch HS2) is thus connected to the capacitors $C_M$ and $C_S$ (the switches HS2 and RST are closed), i.e., to the voltage $V_M$. Instead, the voltage on the second terminal of the inductor L2 corresponds to the voltage $V_{OUT}$. In the embodiment considered, a voltage $V_M - V_{OUT}$ is thus applied to the inductor L2. Consequently, since the voltage on the inductor L2 should be positive during this operating step, the current I2 through the inductor L2 increases, as occurs in a traditional buck converter.

Figure 5D:
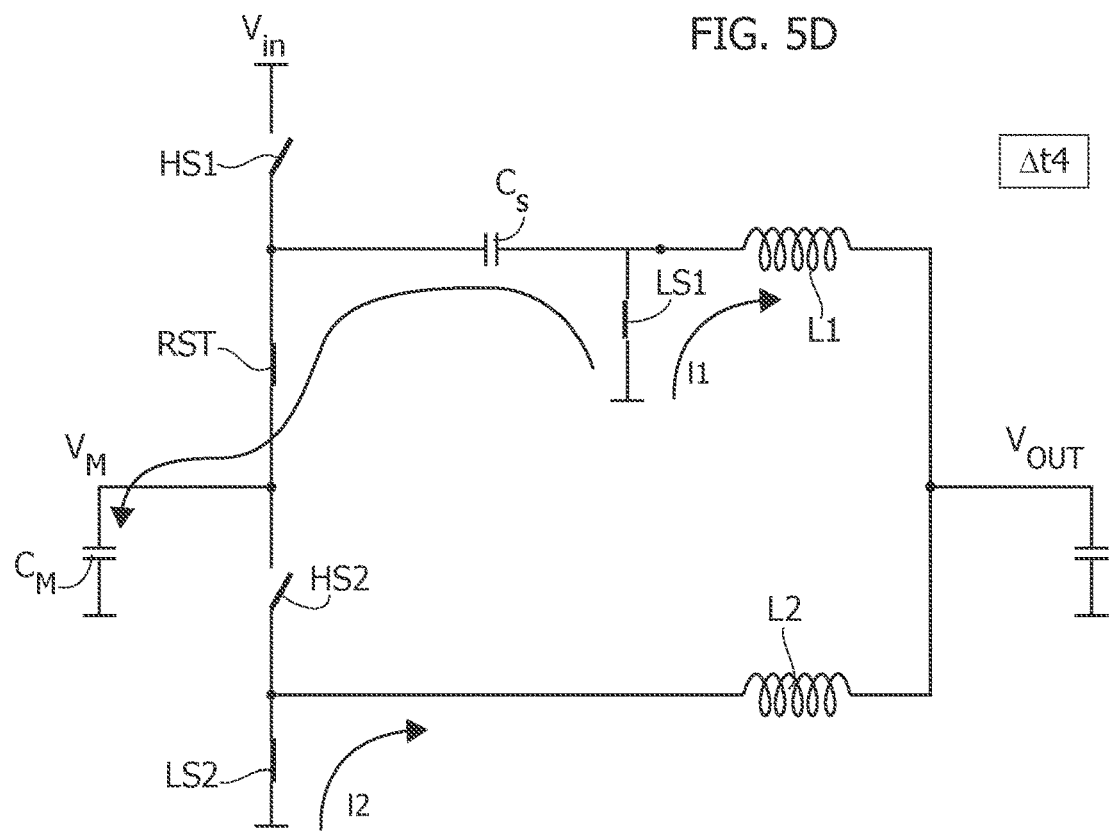

Consequently, when the switch HS2 is set into the open condition and the switch LS3 is set into the closed condition, the first terminal of the inductor L2 (terminal connected to the switch HS2) is now connected to the terminal 10b/ ground GND. This is also illustrated in FIG. 5D. Hence, during this operating step, the voltage on the inductor L2 is negative, and the current I2 through the inductor L2 decreases, as occurs in a traditional buck converter.

In particular, the charge subtracted by the second phase of the converter (HS2, LS2, L2) from the capacitor $C_M$ will produce a variation of voltage $\Delta V_{M2}$, given by the following formula:

$$\Delta V_{M2} = T_{ON2} \cdot I2 / (C_S + C_M)$$

Instead, when the working cycle is longer than the phase shift P (e.g., higher than 50%), superposition of energisation of the first phase (HS1, LS1, and L1) with switching of the second phase (HS2, LS2, and L2) produces a slightly different sequence.

Figure 6:
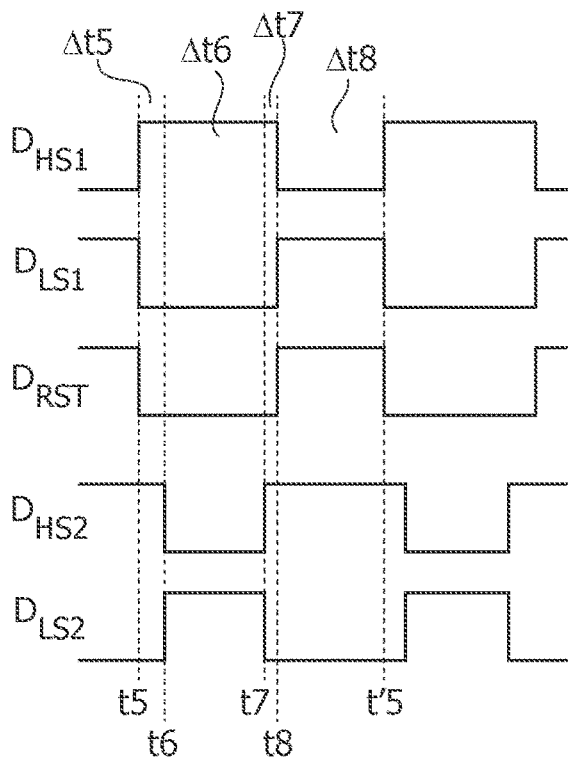
FIG. 6 shows driving signals for a second operation of the converter of FIG. 3.

In particular, as illustrated in FIG. 6, in various embodiments, the control circuit 14a is configured for:
at an instant $t_5$, closing the switch HS1 and opening the switches LS2 and RST;
at an instant $t_6$, opening the switch HS2 and closing the switch LS2;
at an instant $t_7$, closing the switch HS2 and opening the switch LS2; and at an instant $t_8$, opening the switch HS1 and closing the switches LS1 and RST.

Consequently, during a first interval Δt5 (between the instants $t_5$ and $t_6$), the switches HS1 and HS2 are closed, and the switches LS1, RST, and LS2 are open. During a second interval Δt6 (between the instants $t_6$ and $t_7$), the switches HS1 and LS2 are closed, and the switches LS1, RST, and HS2 are open. During a third interval Δt7 (between the instants $t_7$ and $t_8$), the switches HS1 and HS2 are closed, and the switches LS1, RST, and LS2 are open. Finally, during a fourth interval Δt8 (between the instant $t_8$ and the next instant $t_5'$), the switches LS1, RST, and HS2 are closed, and the switches HS1 and LS2 are open.

Hence, in the embodiment considered, the time of a switching cycle corresponds to the sum of the duration of the four intervals, i.e., $$T_{SW1} = T_{SW2} = \Delta t5 + \Delta t6 + \Delta t7 \Delta t8$$

Moreover, the closing time $T_{ON1}$ of the switch HS1 corresponds to the sums of the times Δt5, Δt6, and Δt7, i.e., $T_{ON1} = \Delta t5 + \Delta t6 + \Delta t7$, the closing time $T_{ON2}$ of the switch HS2 corresponds to the sums of the times Δt7, Δt8 and Δt5, i.e., $T_{ON2} = \Delta t7 + \Delta t8 + \Delta t5$, and the phase shift P between the switches HS1 and HS2 is $P = (\Delta t5 + \Delta t6)/T_{SW1}$.

Figure 7A:
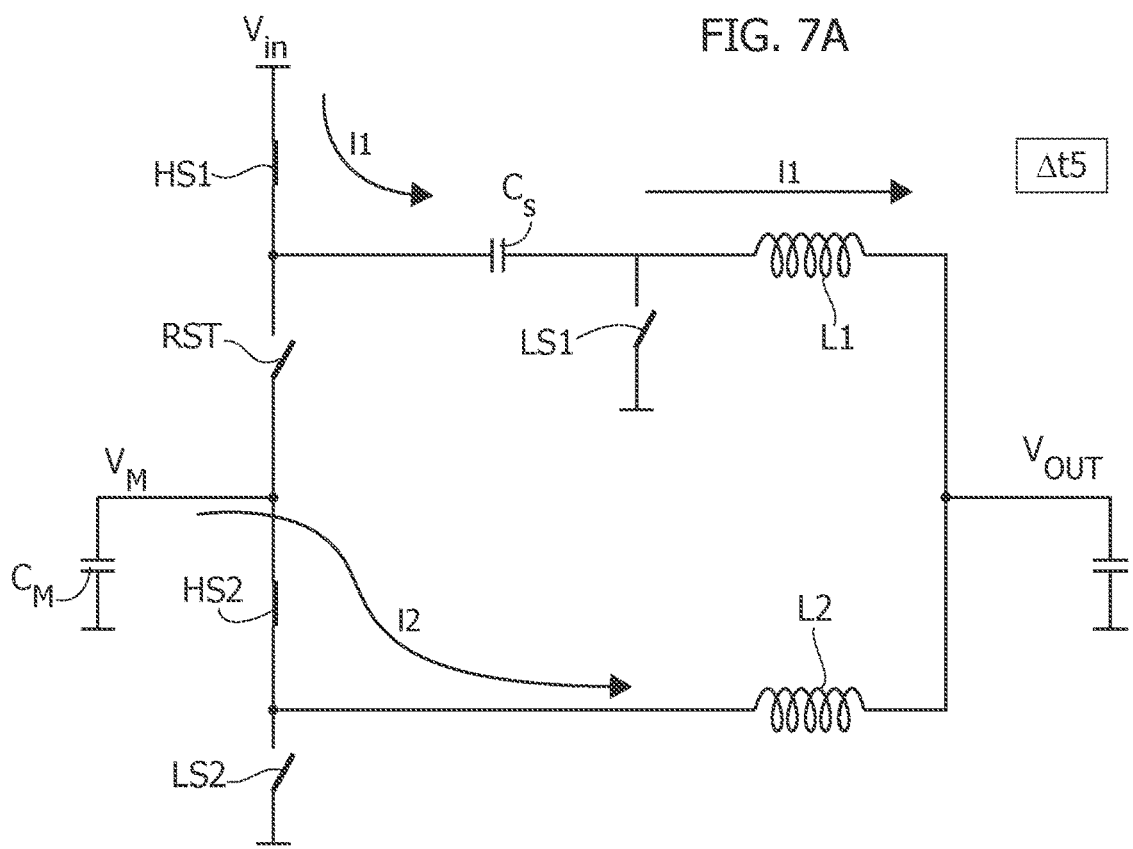
FIGS. 7A to 7D show the operating steps for the driving illustrated in FIG. 6.

FIG. 7A shows, in this context, operation during the first interval Δt5.

In particular, as explained previously, during this operating step, the switches HS1 and HS2 are closed, whereas the switches LS1, RST and LS2 are open. This operating step is hence peculiar in so far as it is not possible with the solution according to the prior art.

In particular, the voltage on the first terminal of the inductor L1 (terminal connected to the capacitor $C_S$) is again equal to $V_{in} - V_S$ (switch HS1 closed and switch LS1 open). Instead, the voltage on the first terminal of the inductor L2 (terminal connected to the switch HS2) is equal to $V_M$ (switch HS2 closed and switch RST open). The voltage on the second terminal of the inductor L1 and the voltage on the second terminal of the inductor L2 in any case correspond to the voltage $V_{OUT}$. Consequently, since the voltages $V_{in} - V_S$ and $V_M$ should be higher than the voltage $V_{OUT}$, the currents I1 and I2 increase.

Figure 7B:
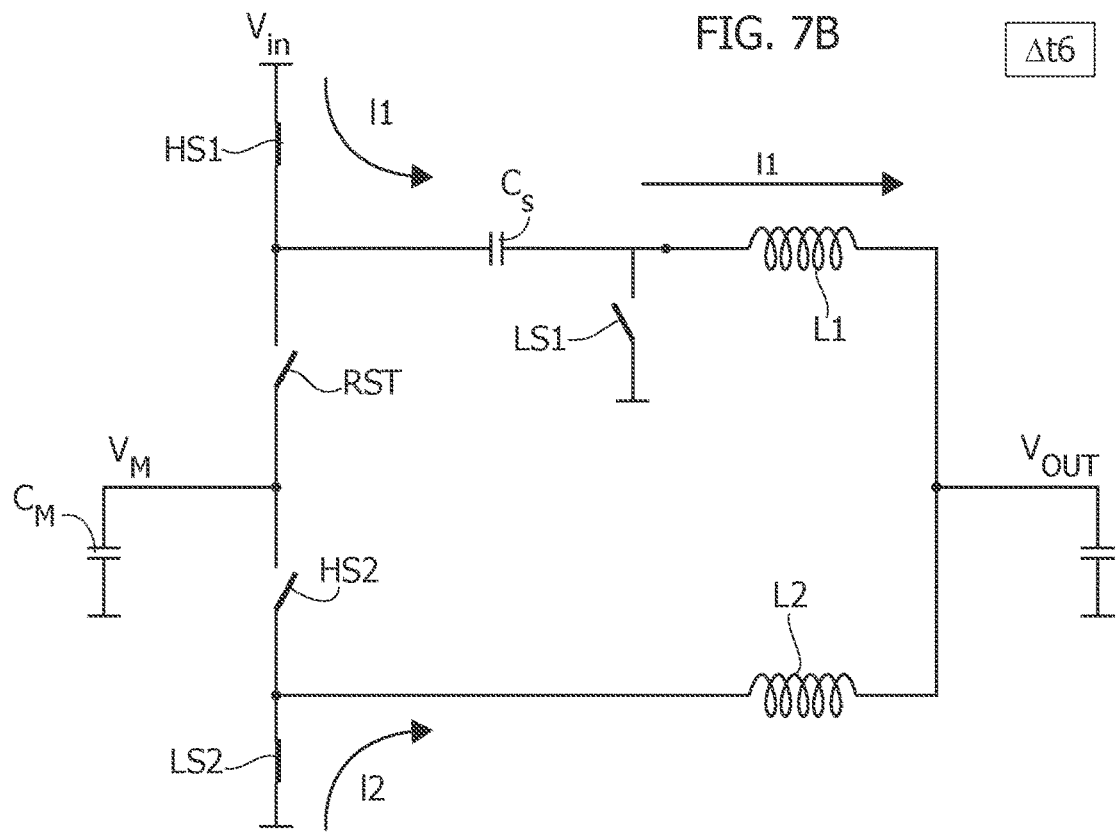
Figure 7C:
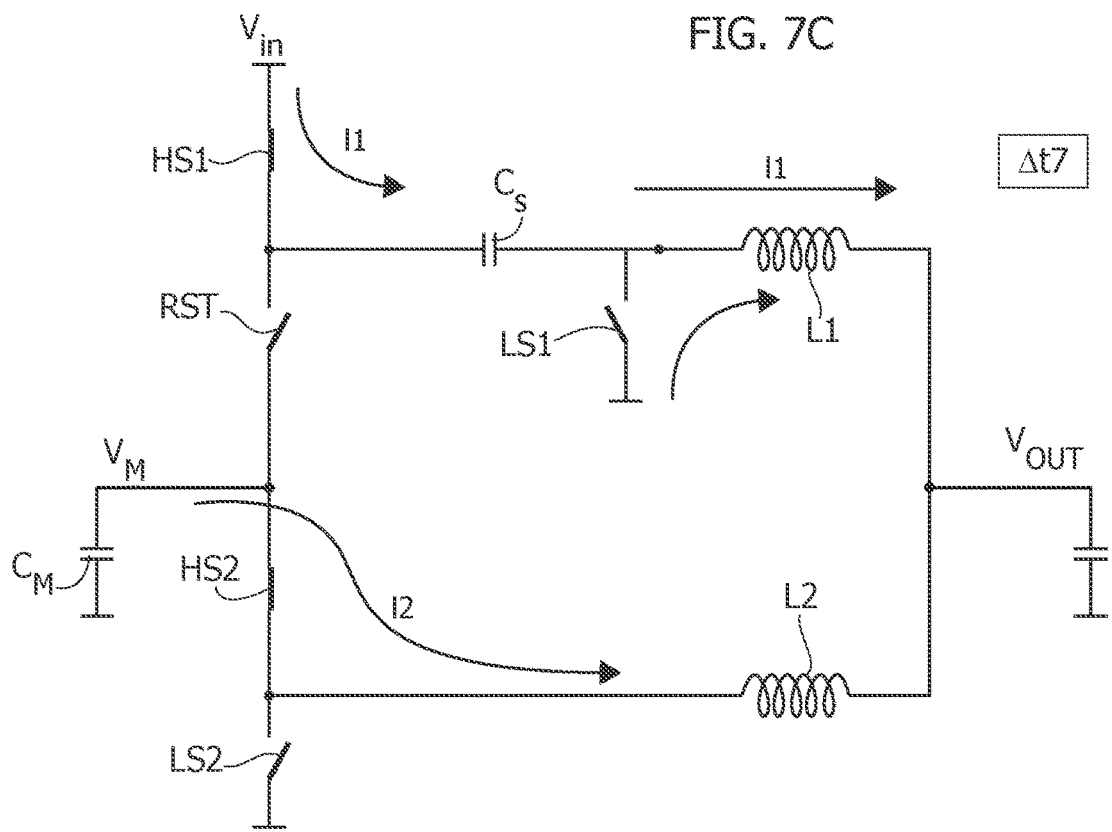

Next, as illustrated in FIG. 7B, the switch HS2 is set into the open condition and the switch LS2 is set into the closed condition. Consequently, from the instant $t_6$ the voltage on the first terminal of the inductor L2 (terminal connected to the switch HS2) is equal to zero and the current I2 decreases, whereas the current I1 of the first phase of the converter (HS1, LS1, and L1) continues to increase.

The above operating step Δt6 hence finishes at the instant $t_7$, when the control circuit 14a opens the switch LS2 and closes the switch HS2. Consequently, this situation basically corresponds to the one described with reference to FIG. 7A; i.e., the current I2 in the capacitor L2 starts to increase, and the current I1 of the first phase of the converter (HS1, LS1, and L1) continues to increase.

Figure 7D:
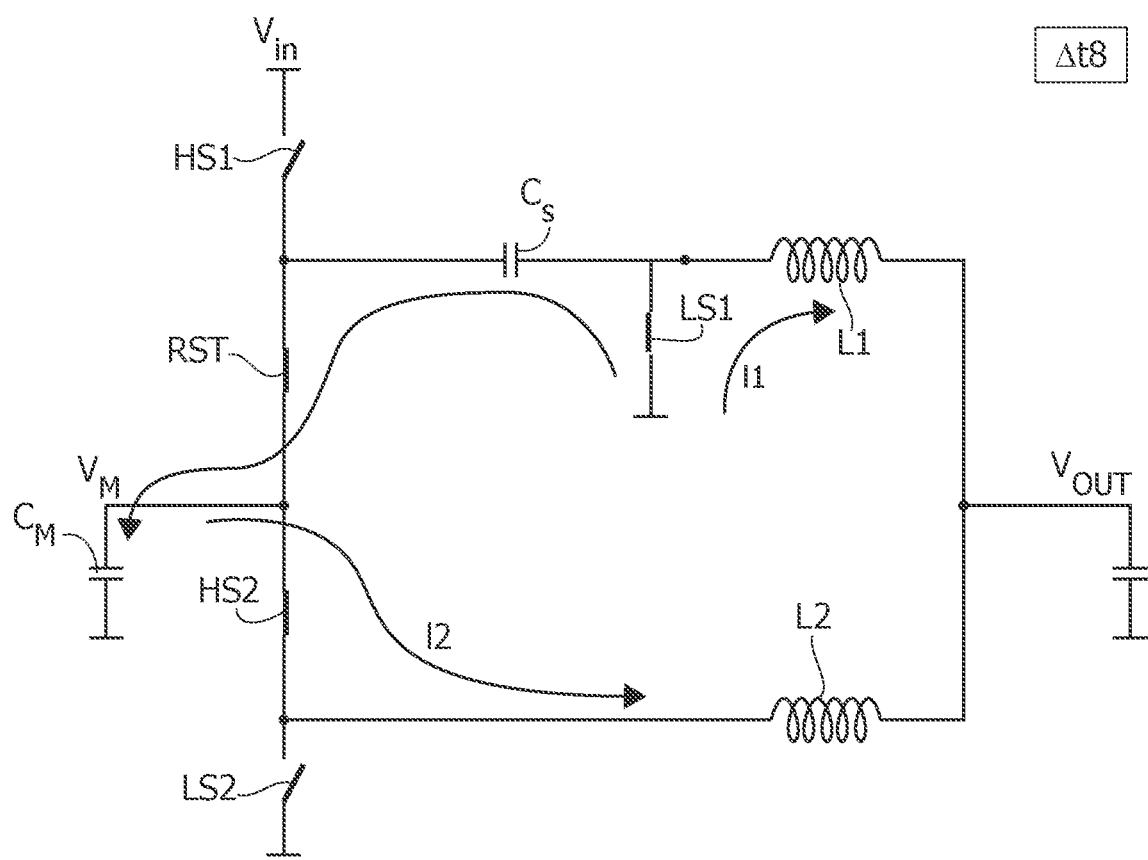

Finally, as also illustrated in FIG. 7D, at the instant $t_8$ the control circuit 14a opens the switch HS1 and closes the switch LS1. Consequently, from the instant $t_8$ the voltage on the first terminal of the inductor L1 (terminal connected to the capacitor $C_S$) is equal to zero, and the current I1 decreases, whereas the current I1 of the second phase of the converter (HS2, LS2, and L2) continues to increase.

However, during this step also the switch RST is set into the closed condition; i.e., the charge accumulated by the capacitor $C_S$ during the other steps is transferred in part onto the capacitor $C_M$ (see also the description of FIG. 5C).

Consequently, also in this case, the charge stored in the capacitor $C_S$ during energization of the first phase of the converter (HS1, LS1, and L1) is transferred onto the capacitor $C_M$ and is used by the second phase of the converter (HS2, LS2, and L2). Hence, by equating the ON times $T_{ON1}$ and $T_{ON2}$ of the switches HS1 and HS2, automatically the balance of the currents in the inductors L1 and L2 is obtained in so far as:

$$T_{ON1} \cdot I1 = T_{ON2} \cdot I2.$$

In fact, in the case where $T_{ON1}=T_{ON2}$, also the currents are equal, i.e., I1=I2.

Consequently, in various embodiments, the control circuit 14a is configured for driving the switches HS1 and HS2 with the same ON time $T_{ON1}=T_{ON2}$ and with the same OFF time $T_{OFF1}=T_{OFF2}$. Moreover, in some embodiments, the control circuit 14a is configured for regulating the duration $T_{ON1}$ and/or $T_{OFF1}$ as a function of the output voltage $V_{OUT}$ in such a way as to regulate the output voltage $V_{OUT}$ on a required value. In this way, a current-sharing correction by the controller 14a is not required.

For instance, in various embodiments, the controller 14a is configured for using a constant time $T_{SW1}$ for the switching cycle and for regulating the duration $T_{ON1}$ in such a way that the output voltage $V_{OUT}$ corresponds to a required value; i.e., the controller 14a can implement a PWM regulation.

For instance, for this purpose, the control circuit 14a can implement a regulator that comprises at least one I (Integral) component, such as a PI (Proportional-Integral) regulator or a PID (Proportional-Integral-Derivative) regulator.

In general, a similar PWM regulation could also be obtained with one or more comparators, which are configured for:
- increasing the time $T_{ON1}$ when the voltage $V_{OUT}$ is below a lower threshold; and
- reducing the time $T_{ON1}$ when the voltage $V_{OUT}$ is above an upper threshold.

However, a regulation system in which the time $T_{ON1}$ is variable and the time $T_{SW1}$ is constant may present problems of instability, in particular during load transients, i.e., when the load changes. In this case, also problems of current sharing between the phases of the converter may emerge.

Consequently, in various embodiments, the control circuit 14a is configured for using a constant ON time $T_{ON1}=T_{ON2}$, whereas the OFF time $T_{OFF1}=T_{OFF2}$ is variable; i.e., the control circuit 14a varies the time of the switching cycle $T_{SW1}=T_{SW2}$. For instance, for this purpose reference may be made to the document U.S. Pat. No. 8,963,519 B2, which describes a control circuit configured for varying the frequency of the switching cycle ($1/T_{SW1}$) as a function of the output voltage $V_{OUT}$. Consequently, also in this case, the switch HS1 (and likewise the switch HS2) is driven by using a PWM driving signal, where the ON time $T_{ON}$ is constant and the duration of the switching cycle $T_{SW}$ is variable. For instance, also for this purpose, a regulator with I component, for example a PI or PID regulator, may be used.

In the solution described previously, the converter 1a hence comprises two buck stages, which are connected in series between the input terminals 10a and 10b. The inventor has noted that this configuration is useful for output voltages $V_{OUT}$ close to $0.5V_{in}$. In order to regulate lower output voltages $V_{OUT}$, it is possible to set a number of buck stages in series in order to work with input voltages of the individual buck stages equal to $V_{in}/N$, where N is the number of buck stages connected in series.

In particular, by grouping the components together, it is possible to define two types of buck stages. The first type of buck stage, referred to hereinafter as "SPH" (Stacked PHase), comprises the switches HS1, LS1, and RST, as well as the capacitor $C_S$ and the inductor L1. Instead, the second type of buck stage, referred to hereinafter as "BPH" (Buck Phase), comprises the switches HS2 and LS2, and the inductor L2.

Figure 8:
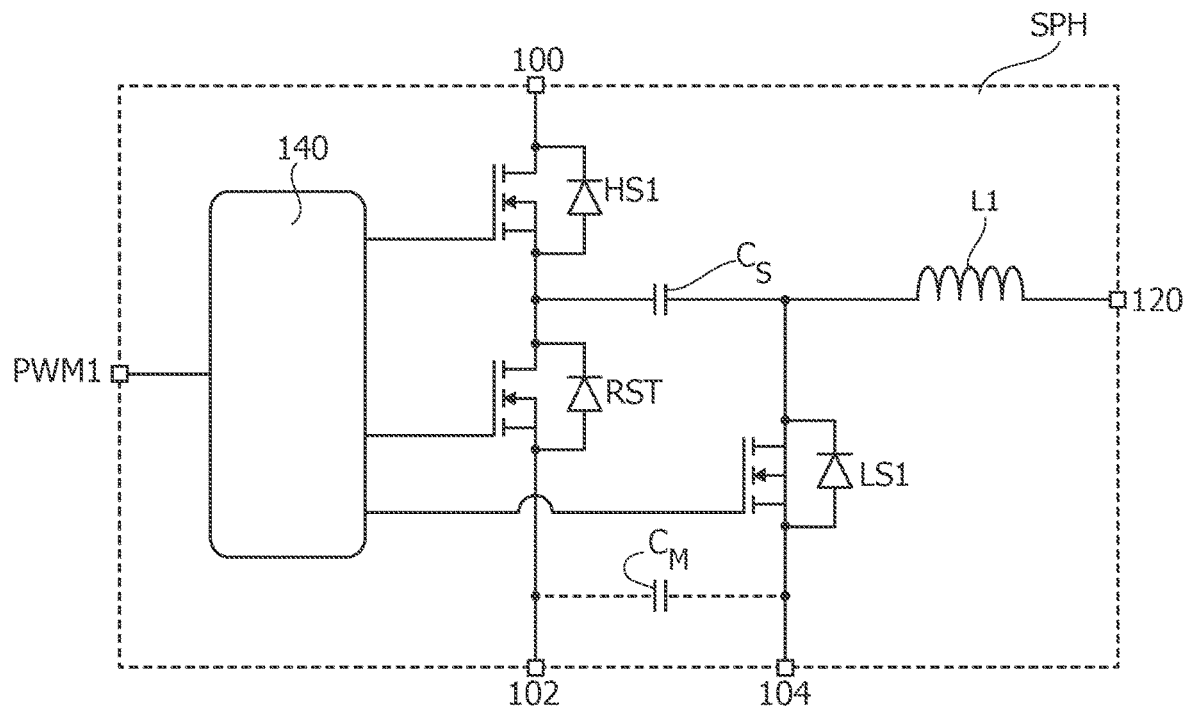
FIGS. 8 and 9 show the embodiment of two modules that can be used for implementing the converter of FIG. 3.

In particular, FIG. 8 shows an embodiment of the stage SPH, which enables a modular converter to be obtained.

In particular, in the embodiment considered, the module SPH comprises four terminals 100, 102, 104, and 120. In particular, two electronic switches HS1 and RST are connected (for example, directly) in series between the terminals 100 and 102. For instance, in the embodiment considered, two n-channel FETs (e.g., MOSFETs) are used, where the drain terminal of the transistor HS1 is connected (for example, directly) to the terminal 100, the source terminal of the transistor HS1 is connected (for example, directly) to the drain terminal of the transistor RST, and the source terminal of the transistor RST is connected (for example, directly) to the terminal 102. A capacitor $C_S$ and an inductor L1 are connected (for example, directly) in series between the intermediate point between the switches HS1 and RST (e.g., the source terminal of the switch HS1) and the terminal 120. In particular, a first terminal of the capacitor $C_S$ is connected (for example, directly) to the switches HS1 and RST, and the second terminal of the capacitor $C_S$ is connected (for example, directly) by via the inductor L1 to the terminal 120. Finally, an electronic switch LS1 is connected between the intermediate point between the capacitor $C_S$ and the inductor L1 and the terminal 104. For instance, in the embodiment considered an n-channel FET (e.g., a MOSFET) is used, where the drain terminal of the transistor LS1 is connected (for example, directly) to the capacitor $C_S$ and the source terminal of the transistor LS1 is connected (for example, directly) to the terminal 104.

Consequently, with reference to FIG. 3, the module illustrated in FIG. 8 can be used for the first phase of the electronic converter 1a when:
- the terminal 100 is connected to the terminal 10a,
- the terminal 102 is connected to the capacitor $C_M$,
- the terminal 104 is connected to the terminal 10b, i.e., ground GND, and
- the terminal 120 is connected to the terminal 12a.

In the embodiment considered, the module SPH further comprises an optional control circuit 140. For instance, in various embodiments, this control circuit 140 is configured for driving the switches HS1, RST, and LS1 as a function of a PWM driving signal received on a further terminal PWM1. For instance, the driving signal applied to the terminal PWM1 may correspond to the driving signal $D_{HS1}$ for the switch HS1, and the control circuit 140 may generate the driving signals $D_{RST}$ and $D_{LS1}$ for the switches RST and LS1 by inverting the aforesaid driving signal.

In general, as for the capacitor $C_S$, the module SPH may also comprise the capacitor $C_M$. For instance, this capacitor $C_M$ may be connected (for example, directly) between the terminals 102 and 104.

Figure 9:
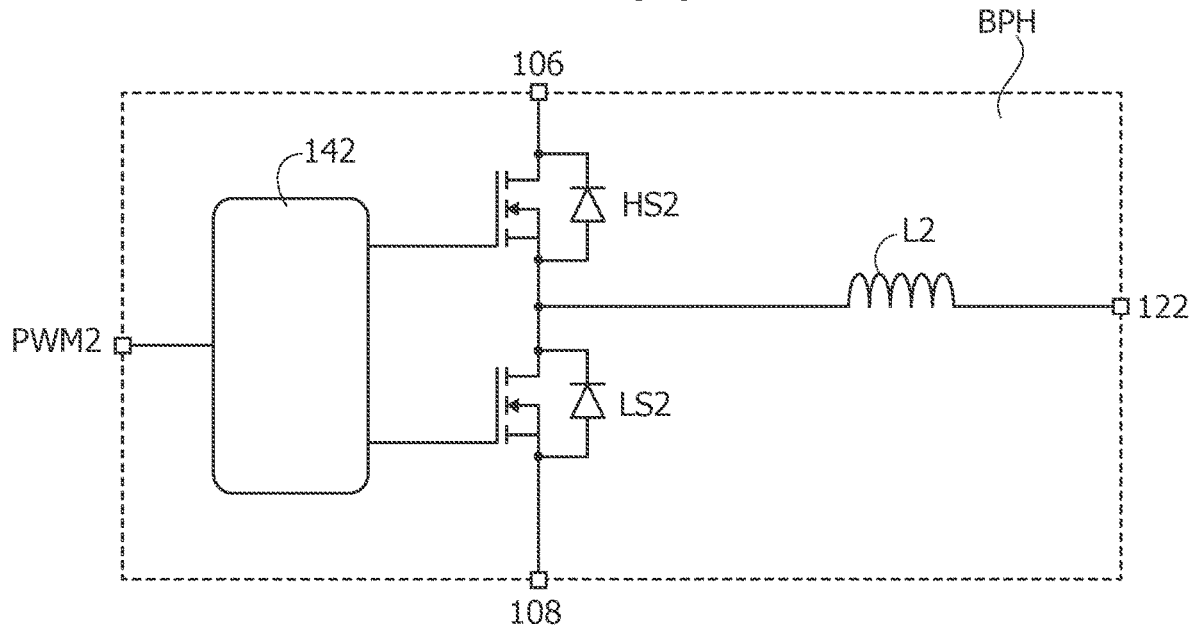

Instead, FIG. 9 shows an embodiment of the stage BPH that enables a modular converter to be obtained.

In particular, in the embodiment considered, the module BPH comprises three terminals 106, 108, and 122. In particular, two electronic switches HS2 and LS2 are connected (for example, directly) in series between the terminals 106 and 108. For instance, in the embodiment considered, two n-channel FETs (e.g., MOSFETs) are used, where the drain terminal of the transistor HS2 is connected (for example, directly) to the terminal 106, the source terminal of the transistor HS2 is connected (for example, directly) to the drain terminal of the transistor LS2, and the source terminal of the transistor LS2 is connected (for example, directly) to the terminal 108. An inductor L2 is connected (for example, directly) between the intermediate point between the switches HS2 and LS2 (e.g., the source terminal of the switch HS1) and the terminal 122.

Consequently, with reference to FIG. 3, the module illustrated in FIG. 9 may be used for the second phase of the electronic converter 1a when:
- the terminal 106 is connected to the capacitor $C_M$,
- the terminal 108 is connected to the terminal 10b, i.e., ground GND, and
- the terminal 122 is connected to the terminal 12a.

In the embodiment considered, the module BPH further comprises an optional control circuit 142. For instance, in various embodiments, this control circuit 142 is configured for driving the switches HS2 and LS2 as a function of a PWM driving signal received on a further terminal PWM2. For instance, the driving signal applied to the terminal PWM2 may correspond to the driving signal $D_{HS2}$ for the switch HS2, and the control circuit may generate the driving signal $D_{LS2}$ for the switch LS2 by inverting the aforesaid driving signal.

Consequently, to implement a multiphase converter, all the buck stages except one (the one connected to ground GND) will comprise the module SPH so as to scale the voltage at input to each buck. Only the last buck stage connected to ground GND does not need to scale the voltage, and it is hence possible to implement the aforesaid buck stage with a simplified stage BPH.

Figure 10A:
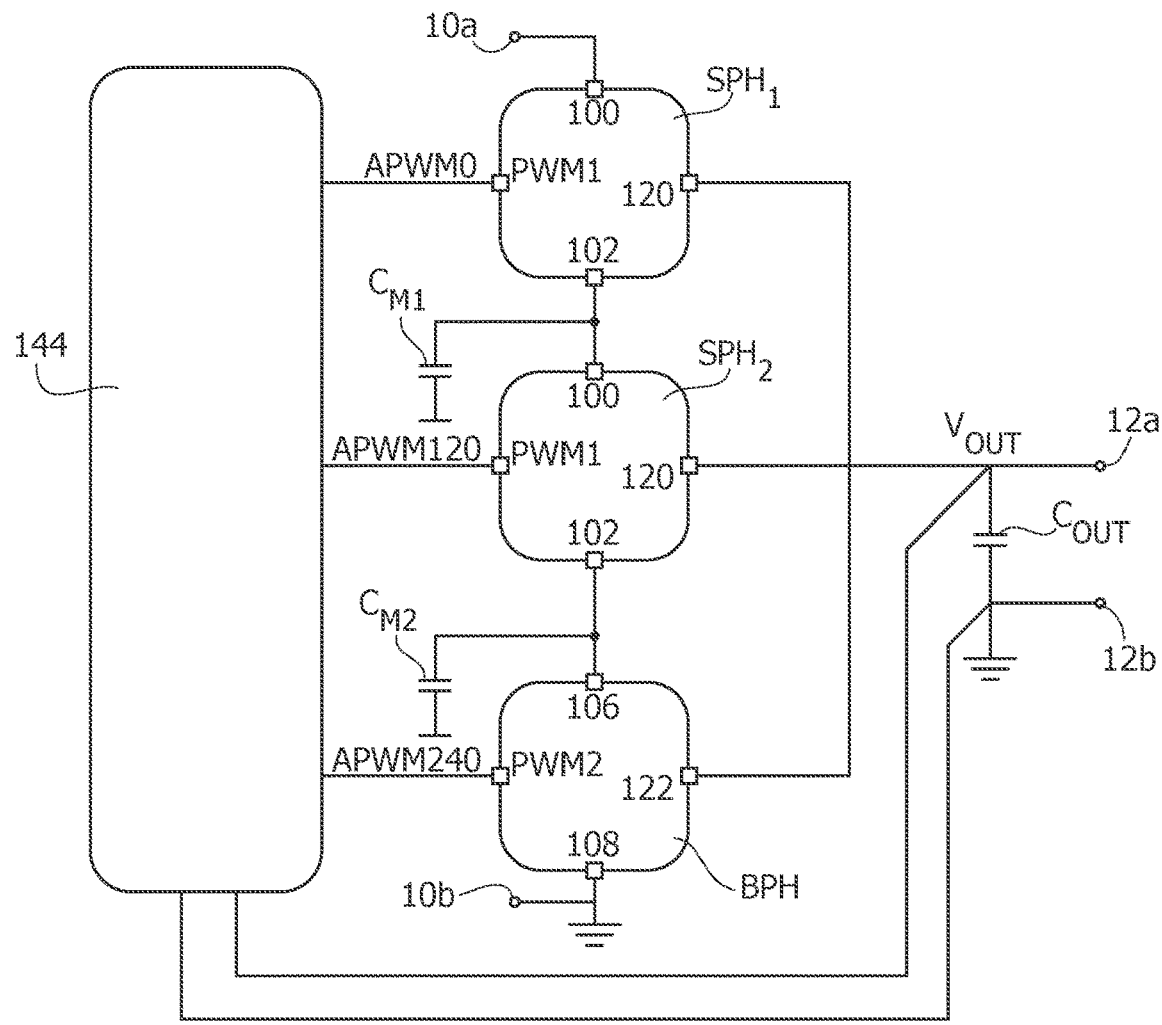
FIGS. 10A, 10B, 11A, 11B, and 12-15 show various embodiments of electronic converters that use the modules of FIGS. 8 and 9.

For instance, FIG. 10A shows an embodiment of an electronic converter, which comprises three buck stages connected in series. Consequently, the converter comprises two stages $SPH_1$ and $SPH_2$ and one stage BPH.

In particular, the terminal 100 of the stage $SPH_1$ is connected to the terminal 10a, the terminal 102 of the stage $SPH_1$ is connected to the terminal 100 of the stage $SPH_2$, the terminal 102 of the stage $SPH_2$ is connected to the terminal 106 of the stage BPH, and the terminal 108 of the stage BPH is connected to the terminal 10b. Moreover, the terminals 120 and 122 of the stages $SPH_1$, $SPH_2$ and BPH are connected to the terminal 12a, where a capacitor $C_{OUT}$ is connected between the output terminals 12a and 12b.

Also illustrated in the embodiment considered are two capacitors $C_{M1}$ and $C_{M2}$, where the first capacitor $C_{M1}$ is connected between the terminal 102 of the stage $SPH_1$ and ground GND, and the second capacitor $C_{M2}$ is connected between the terminal 102 of the stage $SPH_2$ and ground GND.

In the embodiment considered, moreover illustrated is a control circuit 144 configured for generating the driving signals that are applied to the terminals PWM1 and PWM2 of the stages $SPH_1$, $SPH_2$, and BPH. Consequently, in the embodiment considered, the control circuits 140, 142, and 142 implement the control circuit 14a.

For instance, in the embodiment considered, the control circuit 144 generates three PWM signals: APWM0 for the module $SPH_1$, APWM120 for the module $SPH_2$, and APWM240 for the module BPH.

Figure 10B:
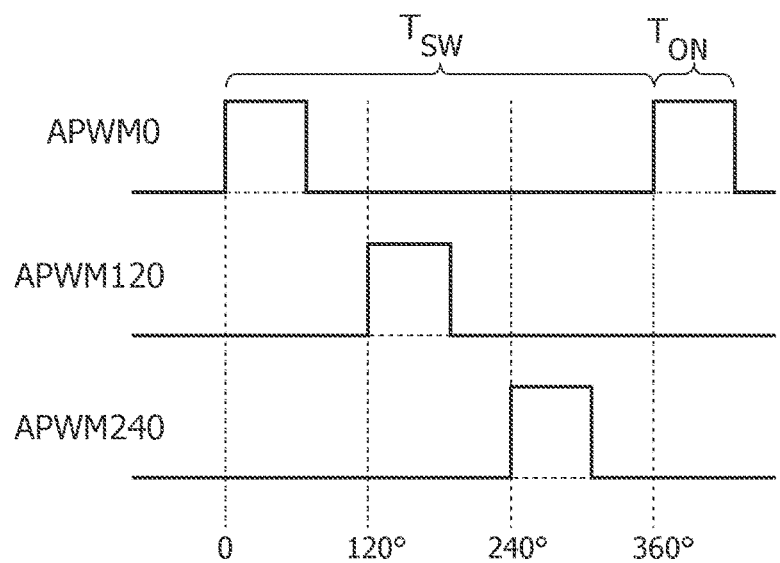

For instance, FIG. 10B shows an embodiment of the signals APWM0, APWM120, and APWM240. In particular, in the embodiment considered the three signals APWM0, APWM120, and APWM240 correspond to three PWM signals that have the same switching period $T_{SW}$ and the same ON time $T_{ON}$, i.e., the same working cycle. However, the signals APWM0, APWM120, and APWM240 are phase-shifted with respect to one another. For instance, in the embodiment considered, the phase shift between the various signals is 120°.

Figure 11A:
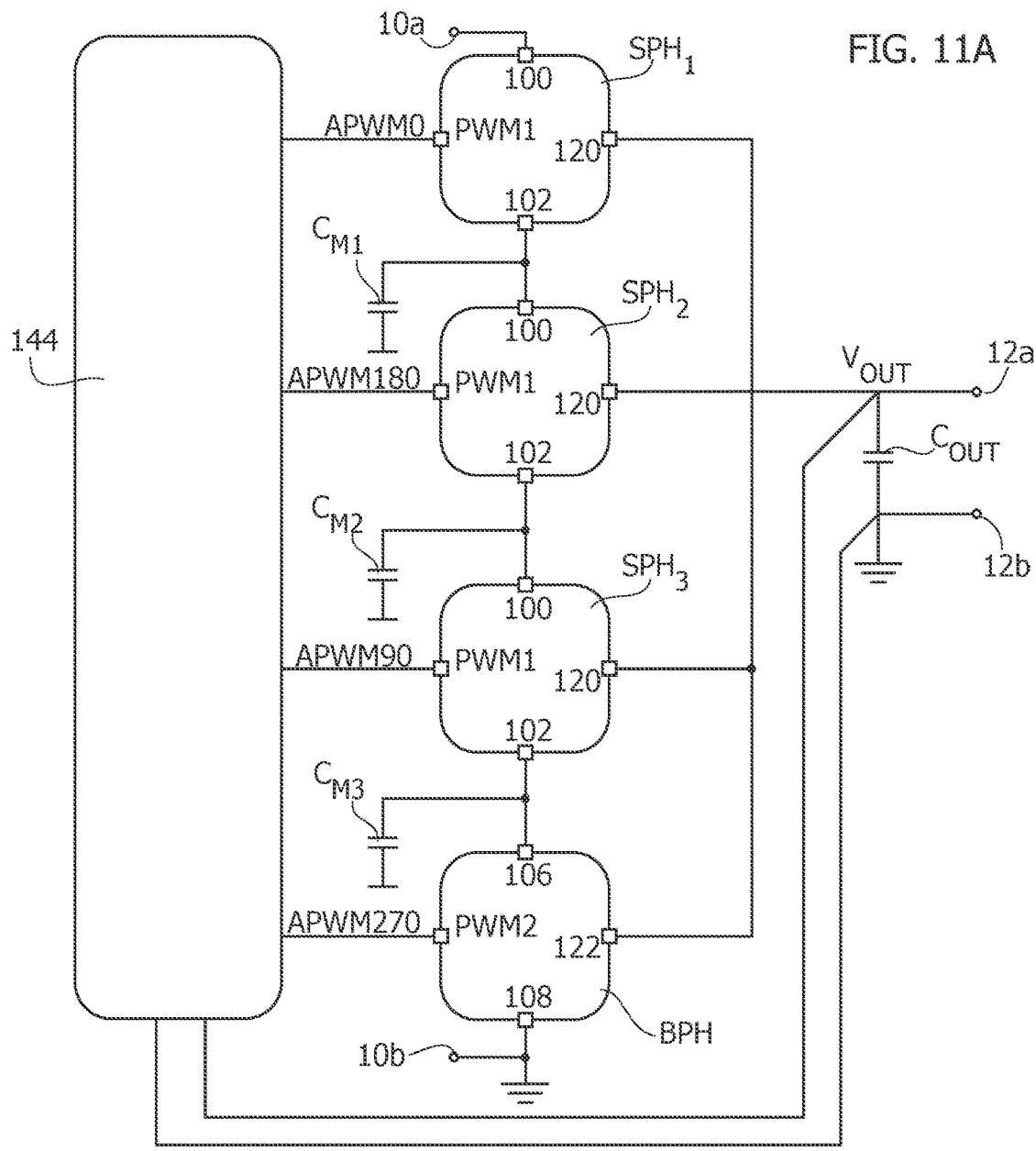

Instead, FIG. 11A shows an embodiment of an electronic converter that comprises four buck stages connected in series. Consequently, the converter comprises three stages $SPH_1$, $SPH_2$, and $SPH_3$, and one stage BPH.

In particular, the terminal 100 of the stage $SPH_1$ is connected to the terminal 10a, the terminal 102 of the stage $SPH_1$ is connected to the terminal 100 of the stage $SPH_2$, the terminal 102 of the stage $SPH_2$ is connected to the terminal 100 of the stage $SPH_3$, the terminal 102 of the stage $SPH_3$ is connected to the terminal 106 of the stage BPH, and the terminal 108 of the stage BPH is connected to the terminal 10b. Moreover, the terminals 120 and 122 of the stages $SPH_1$, $SPH_2$, $SPH_3$, and BPH are connected to the terminal 12a, where a capacitor $C_{OUT}$ is connected between the output terminals 12a and 12b.

Also illustrated in the embodiment considered are three capacitors $C_{M1}$, $C_{M2}$, and $C_{M3}$, where the first capacitor $C_{M1}$ is connected between the terminal 102 of the stage $SPH_1$ and ground GND, the second capacitor $C_{M2}$ is connected between the terminal 102 of the stage $SPH_2$ and ground GND, and the third capacitor $C_{M3}$ is connected between the terminal 102 of the stage $SPH_3$ and ground GND.

Again illustrated in the embodiment considered is a control circuit 144 configured for generating the driving signals that are applied to the terminals PWM1 and PWM2 of the stages $SPH_1$, $SPH_2$, $SPH_3$, and BPH. In particular, in the embodiment considered, the control circuit 144 generates four PWM signals: APWM0 for the module $SPH_1$; APWM180 for the module $SPH_2$; APWM90 for the module $SPH_3$; and APWM270 for the module BPH.

Figure 11B:
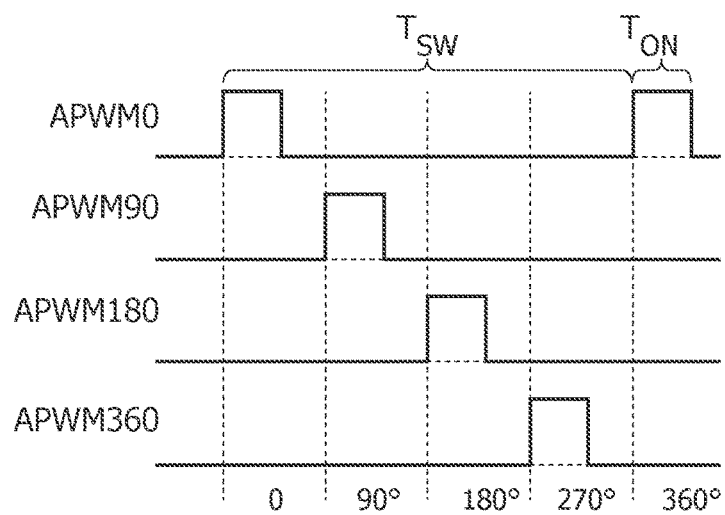

For instance, FIG. 11B shows an embodiment of the signals APWM0, APWM90, APWM180, and APWM270. In particular, in the embodiment considered, the four signals APWM0, APWM90, APWM180, and APWM270 correspond to PWM signals that have the same switching period $T_{SW}$ and the same ON time $T_{ON}$, i.e., the same working cycle. However, the signals APWM0, APWM90, APWM180, and APWM270 are phase-shifted with respect to one another. For instance, in the embodiment considered, the phase shift between the various signals is 90 °.

Figure 12:
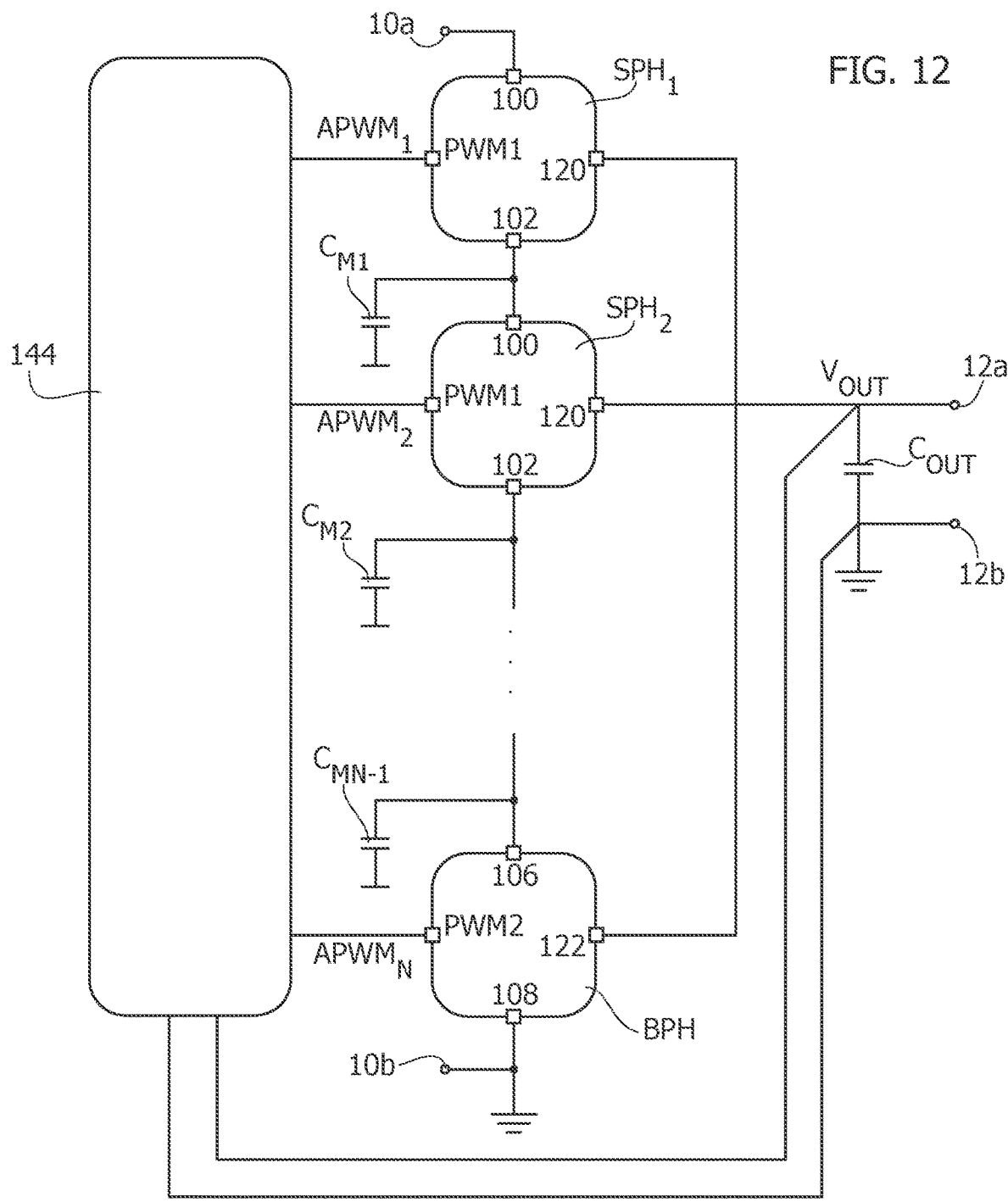

As shown in FIG. 12, the electronic converter 1a may hence comprise N stages connected in series, where the first N-1 stages are of the type SPH illustrated in FIG. 8, where each stage SPH has associated a respective capacitor $C_{M1}$, . . . , $C_{MN-1}$, and the last stage is of the type BPH illustrated in FIG. 9.

In this context, the control circuit 14a, for example implemented with the circuits 140, 142, and 144, can drive the various stages with any phase shift.

For this purpose, the control circuit 14a can drive the electronic switch HS1 of each stage/module SPH with a respective PWM driving signal $D_{HS1}$ having a given period $T_{SW}$ and a given ON time $T_{ON}$. For instance, in the embodiment considered, the driving circuit 144 generates for this purpose respective driving signals $APWM_1$, . . . , $APWM_{N-3}$ for the stages $SPNH_1$, . . . , $SPH_{N-1}$. Moreover, the control circuit 14a can open the electronic switches RST and LS1 when the electronic switch HS1 is closed, and close the electronic switches RST and LS1 when the electronic switch HS1 is open. For instance, using n-channel FETs for all the switches, the control circuit 14a can generate driving signals $D_{RST}$ and $D_{LS1}$ that correspond to the signal $D_{HS1}$ inverted.

In addition, the control circuit 14a can drive the electronic switch HS2 of a stage/module BPH with a PWM driving signal $D_{HS2}$ having the period $T_{SW}$ and the ON time $T_{ON}$. For instance, in the embodiment considered, the driving circuit 144 for this purpose generates, for the stage BPH, a respective driving signal $APWM_N$. Moreover, the control circuit 14a can open the electronic switch LS2 when the electronic switch HS2 is closed, and close the electronic switch LS2 when the electronic switch HS2 is open. For instance, using n-channel FETs for all the switches, the control circuit 14a can generate a driving signal $D_{LS2}$ that corresponds to the signal $D_{HS2}$ inverted.

Finally, in various embodiments, the control circuit 14a varies the ON time $T_{ON}$ or preferably the period $T_{SW}$ as a function of the output voltage $V_{OUT}$, in particular for regulating the output voltage $V_{OUT}$ on a required value.

As explained previously, the control circuit 14a can use any phase shift for the various stages. For instance, the phase shift between the sequences of PWM driving signals (for example, the signals $APWM_1, \ldots, APWM_N$) can be chosen by the user as a function of the board, the coupling between the output coils, or other factors. In fact, as explained previously, the PWM driving signal of one stage may have any phase shift with respect to that of the next or previous stage comprised between 0° and 360°.

In various embodiments, to increase the current-carrying capacity of the system, it is possible to set a number of structures in parallel, thus creating a matrix structure.

Figure 13:
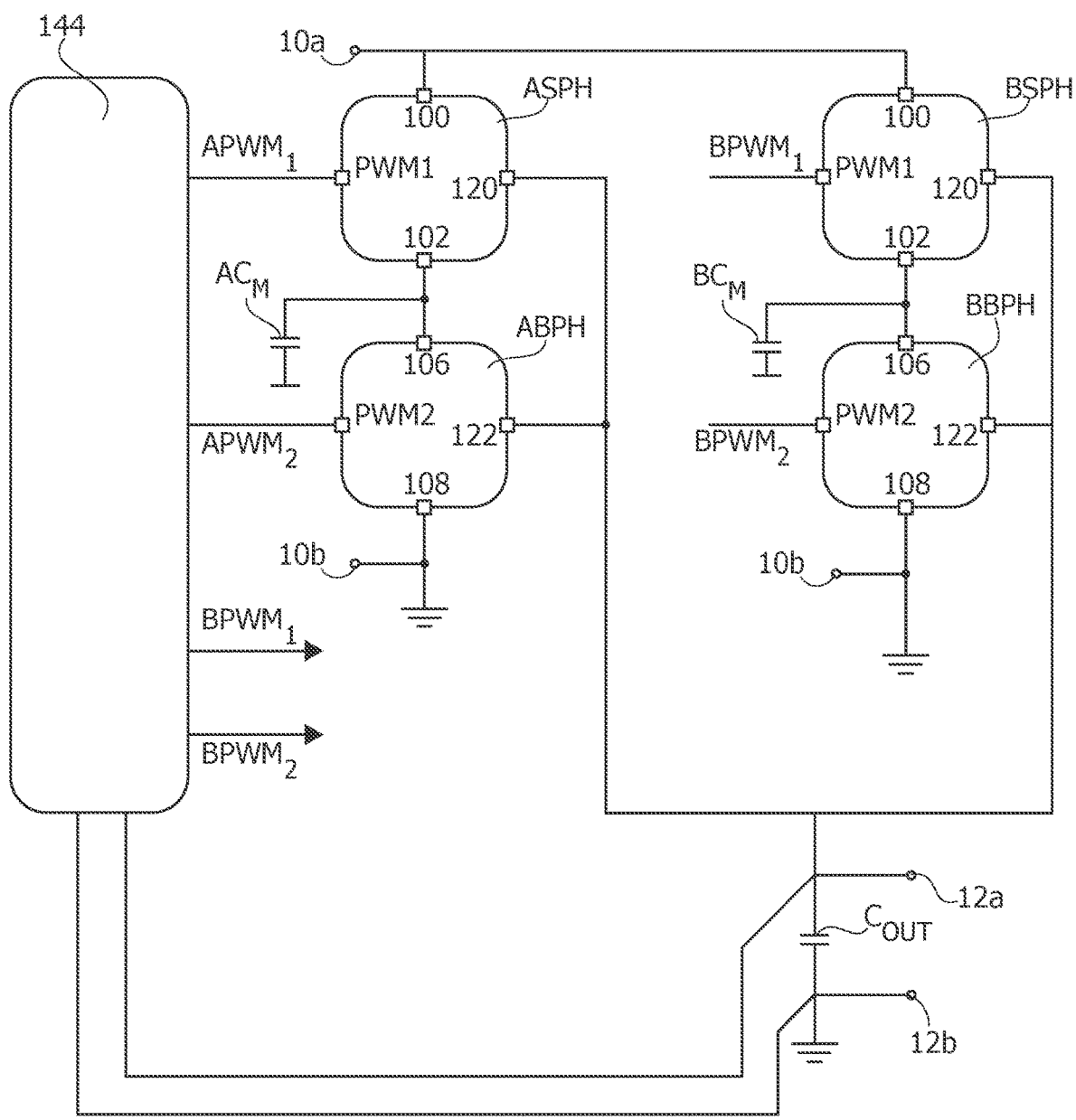

For instance, FIG. 13 shows a 2×2 configuration. In particular, in this case, a first stage ASPH of the type SPH (see FIG. 8) and a first stage ABPH of the type BPH (see FIG. 9) are connected in series between the input terminals 10a and 10b, where the terminals 120 and 122 of the stages ASPH and ABPH are connected to the positive output terminal 12a and a capacitor $AC_M$ is associated to the stage ASPH, for example connected to the terminal 102 of the stage ASPH, which is in turn connected to the terminal 106 of the stage ABPH. Moreover, a second stage BSPH of the type SPH and a second stage BBPH of the type BPH are connected in series between the input terminals 10a and 10b, where also the terminals 120 and 122 of the stages BSPH and BBPH are connected to the positive output terminal 12a and a capacitor $BC_M$ is associated to the stage BSPH, for example connected to the terminal 102 of the stage BSPH, which is in turn connected to the terminal 106 of the stage BBPH.

In the embodiment considered, the control circuit 14a hence generates the driving signals for the switches of the various stages. For instance, in the embodiment considered, the control circuit 144 generates driving signals $APWM_1$, and $APWM_2$ for the stages ASPH and ABPH, respectively, and driving signals BPWM1 and BPWM2 for the stages BSPH and BBPH, respectively.

In various embodiments, the aforesaid driving signals are PWM signals that have the same period $T_{SW}$. Moreover, the driving signals of the stages of one and the same chain/column, for example the stages ASPH and ABPH, have the same ON time $T_{ON}$.

In various embodiments, the phase shift between the driving signals APWM1, APWM2, BPWM1, and BPWM2 may be chosen, for example so as to minimise the capacitances $AC_M$ and $BC_M$. For instance, in various embodiments,
the driving signal $APWM_1$ is in phase with the driving signal $BPWM_2$; and
the driving signal $APWM_2$ is in phase with the driving signal $BPWM_1$, where the driving signal $APWM_2$ is preferably phase-shifted by 180° with respect the driving signal $APWM_1$.

The inventor has noted that in this way it is also possible to carry out an operation of current sharing in order to equalise the supplied currents of the two columns.

In particular, for this purpose, the control circuit 144 can vary the time $T_{ON}$ of each column. For instance, in the case where the first column (ASPH and ABPH) were to carry more current, the control circuit 144 can decrease the time $T_{ON}$ of this column and/or increase that of the second column (BSPH and BBPH).

Figure 14:
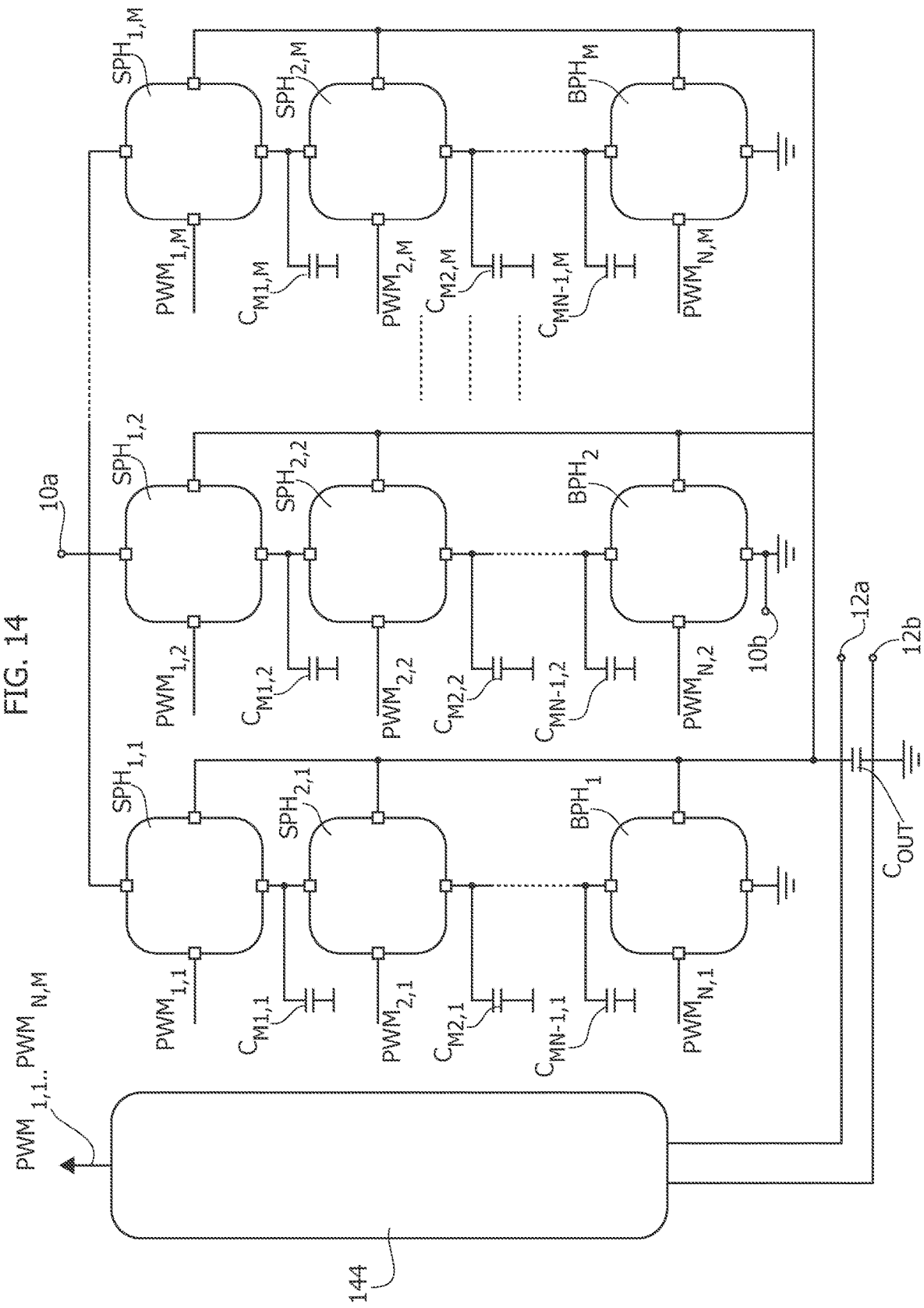

As illustrated in FIG. 14, the topology may hence be generalised to a structure of N×M stages.

In particular each of the M columns comprises N stages connected in series, where:
the first stage is a stage SPH, with the terminal 100 connected to the positive input terminal 10a;
the last stage is a stage BPH, where the terminal 106 is connected to the terminal 102 of the previous stage SPH and the terminal 108 is connected to the negative input terminal 10a; and
the intermediate stages are all stages SPH, with the terminal boo connected to the terminal 102 of the previous stage SPH.

All the columns are then connected in parallel between the terminals 10a and 10b, and the terminals 120 of all stages SPH and the terminals 122 of all staged BPH are connected to the positive output terminal 12a, which is in turn connected by means of one or more capacitors $C_{OUT}$ to the negative output terminal 12b.

In the embodiment considered, the control circuit 14a can hence again generate the driving signals for the switches. For instance, in the embodiment considered, the control circuit 144 generates N×M PWM driving signals$_{1,1}$ ... $PWM_{N,M}$, which all have the same period $T_{SW}$.

However, the control circuit can vary the ON time $T_{ON}$ of each column in order to implement a current-sharing correction. In particular, as explained previously, the possibility of driving each stage of one and the same column with the same ON time $T_{ON}$ leads to having an automatic balancing of the current within the cells of one and the same column. However, it may be advantageous to correct the unbalancing of the currents between different columns to prevent problems of reliability, for example due to the greater heating of the stages that carry more current, and moreover to prevent, in the worst cases, saturation of the cores of the output inductors. To do this, it is possible to use any multiphase control, with fixed frequency or variable frequency. In fact, in general it is sufficient for all the stages SPH and BPH of one column to use PWM driving signals with one and the same period $T_{SW}$ and one and the same ON time $T_{ON}$.

In particular, in various embodiments, the control circuit 14a (for example, by using an appropriate configuration of the circuit 144) is configured for regulating first the period $T_{SW}$ to obtain the required output voltage $V_{OUT}$. Next, the control circuit 14a detects whether the load remains stable, for example because the control circuit 14a no longer varies the period $T_{SW}$. Then, when the load is stable, i.e., in the absence of transients, the control circuit 14a varies the ON time $T_{ON}$ of each column in such a way as to implement a current-sharing correction.

Figure 15:
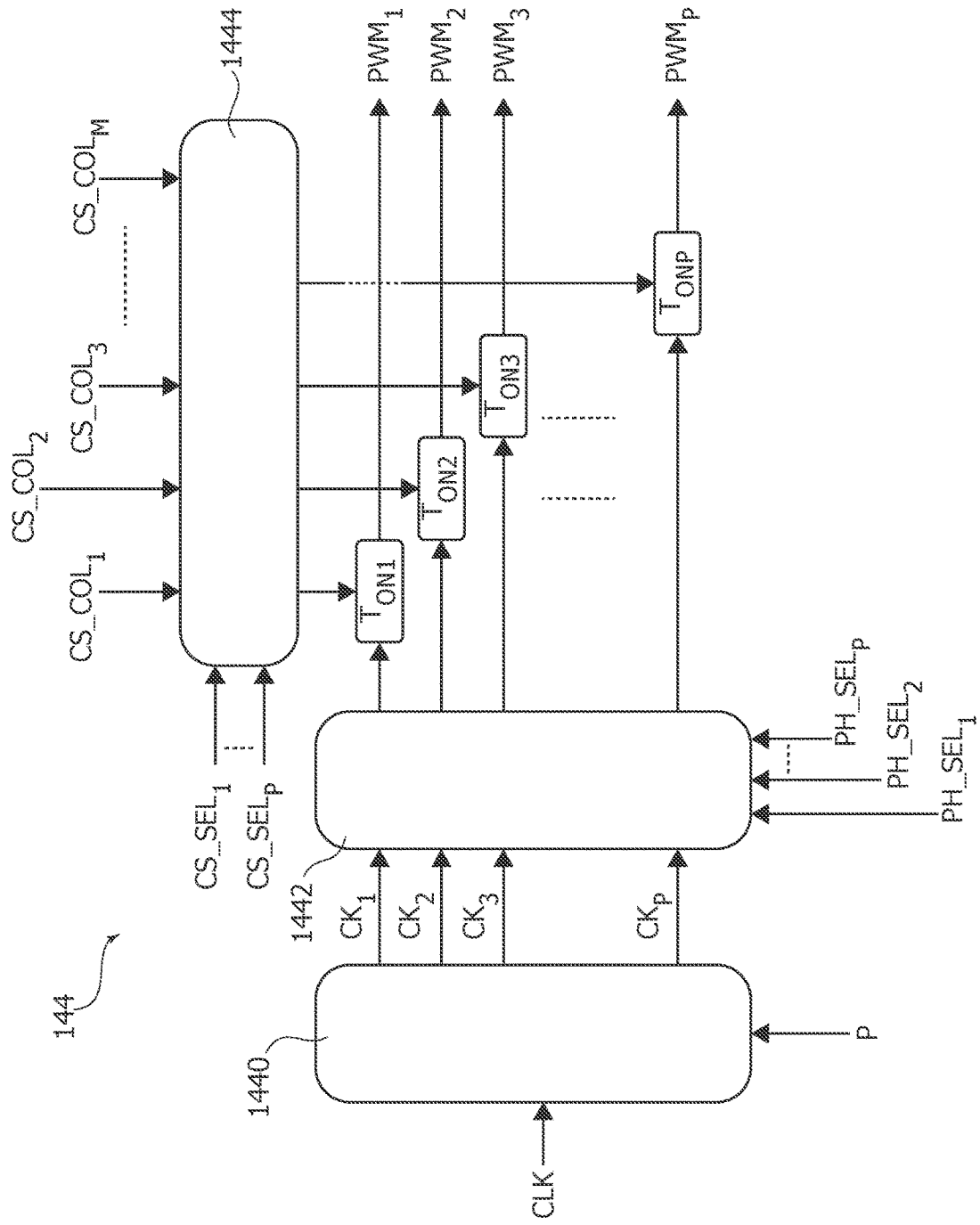

For instance, FIG. 15 shows a possible embodiment of the control circuit 144 configured for generating P driving signals $PWM_1, \ldots, PWM_P$ for P stages SPH and BPH. In various embodiments, the parameter P may be programmable. For instance, with reference to FIG. 14, the parameter P corresponds to N×M.

In the embodiment considered, the control circuit 144 comprises a finite-state machine 1440. In particular, the finite-state machine 1440, implemented for example by using a digital circuit, is configured for generating, in response to a clock signal CLK P clock signals $CK_1, \ldots, CK_P$ at a lower frequency. In particular, the circuit 1440 generate P clock signals $CK_1, \ldots, CK_P$ that have the same period, which hence identifies the period $T_{SW}$. In various embodiments, each signal CK produced has a phase shift with respect to the previous and next signal CK of +/−360°/P. Hence, by varying the frequency of the clock signal CLK, the period $T_{SW}$ can be varied for all the driving signals.

In the embodiment, the signals $CK_1, \ldots, CK_P$ are then supplied to a selection circuit 1442 that associates one of the clock signals $CK_1, \ldots, CK_P$ to each driving signal $PWM_1, \ldots, PWM_P$. For instance, for this purpose the circuit 1442 can receive, for each signal $PWM_1, \ldots, PWM_P$, a respective selection signal $PH\_SEL_1, \ldots, PH\_SEL_P$. In general, the circuit 1442 is purely optional, since the assignment of the signals $CK_1, \ldots, CK_P$ to the signals $PWM_1, \ldots, PWM_P$ could also be fixed at a hardware level.

Finally, the circuit 144 comprises a circuit 1444 configured for varying the ON time $T_{ON1}, \ldots, T_{ONP}$ of each signal $PWM_1, \ldots, PWM_P$.

For this purpose, the circuit 1444 can receive data $CS\_SEL_1, \ldots, CS\_SEL_P$, which associate each signal $PWM_1, \ldots, PWM_P$ to a respective column $1, \ldots, M$ of the matrix of stages N×M (see also FIG. 14). In general, this function of the circuit 1444 is purely optional, since the assignment of the $PWM_1, \ldots, PWM_P$ to the columns $1, \ldots, M$ could also be fixed at a hardware level.

Moreover, the circuit 1444 receives data that identify the phase shift of the current $CS\_COL_1, \ldots, CS\_COL_M$ of each column $1, \ldots, M$. Hence, the circuit 1444 can vary the ON time $T_{ON1}, \ldots, T_{ONP}$ of the signals $PWM_1, \ldots, PWM_P$ in such a way that all the signals $PWM_1, \ldots, PWM_P$ that belong to one and the same column (as identified, for example, by the signals $CS\_SEL_1, \ldots, CS\_SEL_P$) have the same ON time $T_{ON}$, and the circuit varies this duration as a function of the data $CS\_COL_1, \ldots, CS\_COL_M$.

Of course, without prejudice to the principle of the invention, the details of construction and the embodiments may vary widely with respect to what has been described and illustrated purely by way of example herein, without thereby departing from the scope of the present invention, as defined by the ensuing claims.

What is claimed is:

1. An electronic converter comprising:
an input terminal configured to receive an input voltage;
an output terminal configured to supply an output voltage;
an output capacitor coupled to the output terminal;
a first electronic switch coupled between the input terminal and the output terminal;
a second electronic switch coupled between the first electronic switch and a first node;
a first capacitor coupled between the first electronic switch and the output terminal;
a first inductor coupled between the first capacitor and the output terminal;
a third electronic switch coupled to a second node that is coupled between the first capacitor and the first inductor;
a second capacitor coupled to the first node;
a fourth electronic switch coupled between the first node and the output terminal;
a second inductor coupled between the fourth electronic switch and the output terminal;
a fifth electronic switch coupled to a third node that is coupled between the fourth electronic switch and the second inductor; and
a control circuit configured to, during a switching cycle, close the first and fourth electronic switches and open the second, third, and fifth electronic switches to simultaneously cause a first current to flow from the input terminal to the output terminal via the first inductor, and a second current to flow from the first node to the output terminal via the second inductor,
wherein the control circuit is configured to drive the first electronic switch with a first pulse width modulation (PWM) driving signal, and wherein the first PWM driving signal has a working cycle higher than 50%.

2. The electronic converter of claim 1, wherein the control circuit is configured to periodically close the first electronic switch with a predetermined fixed switching period.

3. The electronic converter of claim 1, wherein the control circuit is configured to:
drive the second electronic switch with a second PWM driving signal, the second PWM driving signal being an inverted version of the first PWM driving signal;
drive the third electronic switch with the second PWM driving signal;
drive the fourth electronic switch with a third PWM driving signal; and
drive the fifth electronic switch with a fourth PWM driving signal the fourth PWM driving signal being an inverted version of the third PWM driving signal.

4. The electronic converter of claim 1, wherein the control circuit is configured to periodically close the first electronic switch with a switching period, and to vary the switching period as a function of the output voltage.

5. The electronic converter of claim 1, wherein each of the first, second, third, fourth, and fifth electronic switches comprises respective metal-oxide semiconductor field-effect transistors (MOSFETs).

6. The electronic converter of claim 1, wherein each of the first, second, third, fourth, and fifth electronic switches comprises respective n-type transistors.

7. The electronic converter of claim 1, wherein electronic converter is a step-down converter.

8. An electronic circuit comprising:
a first terminal configured to receive an input voltage;
a second terminal configured to be coupled to an output node via a first inductor;
a third terminal configured to be coupled to the output node via a second inductor;
a fourth terminal configured to be coupled to a first capacitor;
a fifth terminal configured to be coupled to the second terminal via a second capacitor;
a first electronic switch coupled between the first terminal and the fifth terminal;
a second electronic switch coupled between the fifth terminal and the fourth terminal;
a third electronic switch coupled to the second terminal;
a fourth electronic switch coupled between the fourth terminal and the third terminal;
a fifth electronic switch coupled to the third terminal; and
a control circuit configured to generate an output voltage at the output node by controlling the first, second, third, fourth, and fifth electronic switches, wherein the control circuit is configured to, during a switching cycle, close the first and fourth electronic switches and open the second, third, and fifth electronic switches to simultaneously cause a first current to flow from the first terminal to the output node via the first inductor, and a second current to flow from the fourth terminal to the output node via the second inductor, wherein the control circuit is configured to drive the first electronic switch with a first pulse width modulation (PWM) having a working cycle higher than 50%.

9. The electronic circuit of claim 8, wherein the control circuit is configured to periodically close the first electronic switch with a predetermined fixed switching period.

10. The electronic circuit of claim 8, wherein the control circuit is configured to periodically close the first electronic switch with a switching period, and to vary the switching period as a function of the output voltage.

11. The electronic circuit of claim 8, wherein each of the first, second, third, fourth, and fifth electronic switches comprises respective metal-oxide semiconductor field-effect transistors (MOSFETs).

12. The electronic circuit of claim 8, wherein each of the first, second, third, fourth, and fifth electronic switches is an NMOS transistor.

13. An electronic converter comprising:
an input terminal configured to receive an input voltage;
an output terminal configured to supply an output voltage;
an output capacitor coupled to the output terminal;
a first electronic switch coupled between the input terminal and the output terminal;
a second electronic switch coupled between the first electronic switch and a first node;
a first capacitor coupled between the first electronic switch and the output terminal;
a first inductor coupled between the first capacitor and the output terminal;
a third electronic switch coupled to a second node that is coupled between the first capacitor and the first inductor;
a second capacitor coupled to the first node;
a fourth electronic switch coupled between the first node and the output terminal;
a second inductor coupled between the fourth electronic switch and the output terminal;

a fifth electronic switch coupled to a third node that is coupled between the fourth electronic switch and the second inductor; and a control circuit configured to control the first and fourth electronic switches so that, in a switching cycle, the first electronic switch is closed and the fourth electronic switch is open during a first period of time of the switching cycle, and the first electronic switch and the fourth electronic switch are both closed for a second period of time of the switching cycle.

14. The electronic converter of claim 13, wherein the control circuit is configured to periodically close the first electronic switch with a predetermined fixed switching period.

15. The electronic converter of claim 13, wherein the control circuit is configured to:
drive the first electronic switch with a first pulse width modulation (PWM) driving signal;
drive the second electronic switch with a second PWM driving signal, the second PWM driving signal being an inverted version of the first PWM driving signal;
drive the third electronic switch with the second PWM driving signal;
drive the fourth electronic switch with a third PWM driving signal; and
drive the fifth electronic switch with a fourth PWM driving signal the fourth PWM driving signal being an inverted version of the third PWM driving signal.

16. The electronic converter of claim 15, wherein the first PWM driving signal has a working cycle higher than 50%.

17. The electronic converter of claim 13, wherein the control circuit is configured to periodically close the first electronic switch with a switching period, and to vary the switching period as a function of the output voltage.

18. The electronic converter of claim 13, wherein each of the first, second, third, fourth, and fifth electronic switches comprises respective transistors of the same type.

19. The electronic converter of claim 13, wherein each of the first, second, third, fourth, and fifth electronic switches comprises respective metal-oxide semiconductor field-effect transistors (MOSFETs).

20. The electronic converter of claim 13, wherein each of the first, second, third, fourth, and fifth electronic switches comprises an NMOS transistor.

* * * * *